(12) United States Patent
Choi et al.

(10) Patent No.: US 12,144,216 B2
(45) Date of Patent: Nov. 12, 2024

(54) DISPLAY DEVICE

(71) Applicant: Samsung Display Co., Ltd., Yongin-Si (KR)

(72) Inventors: Dongwon Choi, Seoul (KR); Jin Hwan Choi, Seoul (KR); Beomjin Kim, Asan-si (KR); Taewoong Kim, Seongnam-si (KR); Jonghwa Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 428 days.

(21) Appl. No.: 17/505,794

(22) Filed: Oct. 20, 2021

(65) Prior Publication Data

US 2022/0238626 A1    Jul. 28, 2022

(30) Foreign Application Priority Data

Jan. 25, 2021   (KR) ......................... 10-2021-0010164

(51) Int. Cl.
*H10K 59/131*   (2023.01)
*H10K 77/10*    (2023.01)

(52) U.S. Cl.
CPC ......... *H10K 59/131* (2023.02); *H10K 77/111* (2023.02); *G09G 2380/02* (2013.01)

(58) Field of Classification Search
CPC ... H10K 59/131; G06F 1/1624; G06F 1/1626; G06F 1/1652; G06F 3/044; G09F 9/301
USPC ......................................................... 257/40
See application file for complete search history.

(56) References Cited

U.S. PATENT DOCUMENTS

| 9,940,892 B2 | 4/2018 | Pang |
| 10,074,824 B2 | 9/2018 | Han et al. |
| 10,362,690 B2 | 7/2019 | Han |
| 10,887,438 B2 | 1/2021 | Baek et al. |
| 11,032,402 B2 | 6/2021 | Liu et al. |
| 2019/0069421 A1* | 2/2019 | Lee ............... H04M 1/0268 |
| 2020/0060028 A1* | 2/2020 | Kim ............... H05K 5/03 |
| 2020/0348727 A1* | 11/2020 | Lee ............... G06F 1/1624 |
| 2021/0165458 A1* | 6/2021 | Lee ............... G06F 1/1652 |

FOREIGN PATENT DOCUMENTS

| CN | 111477116 | 7/2020 |
| KR | 10-1682491 | 12/2016 |
| KR | 10-2017-0095636 | 8/2017 |
| KR | 10-2018-0036904 | 4/2018 |
| KR | 10-2019-0042530 | 4/2019 |
| KR | 10-2019-0101605 | 9/2019 |
| KR | 10-2020-0021580 | 3/2020 |
| KR | 10-2020-0094763 | 8/2020 |
| WO | 2019/179616 | 9/2019 |

* cited by examiner

*Primary Examiner* — Fazli Erdem
(74) *Attorney, Agent, or Firm* — F. CHAU & ASSOCIATES, LLC

(57) ABSTRACT

A display device includes a display module. A support layer is disposed below the display module. A plurality of support bars is disposed inside the support layer and extends outside of the support layer. Each of the plurality of support bars includes first and second ends that are disposed outside of the support layer. A plurality of joints are configured to receive the first and second ends of the plurality of support bars. The plurality of joints are coupled to each other. The coupled plurality of joints are configured to rotate with respect to each other.

20 Claims, 20 Drawing Sheets

DISPLAY DEVICE

CROSS-REFERENCE TO RELATED APPLICATIONS

This U.S. non-provisional patent application claims priority under 35 U.S.C. § 119 to Korean Patent Application No. 10-2021-0010164, filed on Jan. 25, 2021 in the Korean Intellectual Property Office, the disclosure of which is incorporated by reference in its entirety herein.

1. TECHNICAL FIELD

The present inventive concepts herein relate to a display device.

2. DISCUSSION OF RELATED ART

Various electronic devices include a display device for displaying an image to a user, such as a smartphone, a digital camera, a laptop computer, a navigation unit, and a smart television. The display device generates an image and provides the image to the user through a display screen.

In recent years, various types of display devices have been developed. For example, various flexible display devices that are deformable, foldable, and/or rollable into a curved shape have been developed. The flexible display device may generally provide increased portability and user convenience.

A flexible display panel that is used in flexible display devices may be deformable in various manners. However, the flexible display panel may not maintain flatness when in an unfolded/non-deformed state.

SUMMARY

The present inventive concepts provide a display device that maintains flatness of a display module when the display module is unfolded.

According to an embodiment of the present inventive concepts, a display device includes a display module and a support layer disposed below the display module. A plurality of support bars is disposed inside the support layer and extends outside of the support layer. Each of the plurality of support bars includes first and second ends that are disposed outside of the support layer. A plurality of joints are configured to receive the first and second ends of the plurality of support bars. The plurality of joints are coupled to each other. The coupled plurality of joints are configured to rotate with respect to each other.

According to an embodiment of the present inventive concepts, a display device includes a display module. A support layer is disposed below the display module. A plurality of support bars protrudes from first and second sides of the support layer. A plurality of joints is arranged along the first and second sides of the support layer. The plurality of joints are coupled to each other and the coupled plurality of joints are configured to rotate with respect to each other. At least two support bars of the plurality of support bars are inserted into grooves defined in a k-th joint of the plurality of joints in which k is a natural number.

According to an embodiment of the present inventive concepts, a rollable display device includes a display module. A support layer having a flat top surface is disposed below the display module to support the display module. A plurality of support bars protrudes from the support layer. Each of the plurality of support bars has a modulus that is greater than a modulus of the top surface of the support layer.

BRIEF DESCRIPTION OF THE DRAWINGS

The accompanying drawings are included to provide a further understanding of the present inventive concepts, and are incorporated in and constitute a part of this specification. The drawings illustrate embodiments of the present inventive concepts and, together with the description, serve to explain principles of the present inventive concepts. In the drawings.

DETAILED DESCRIPTION OF EMBODIMENTS

Figure 1:
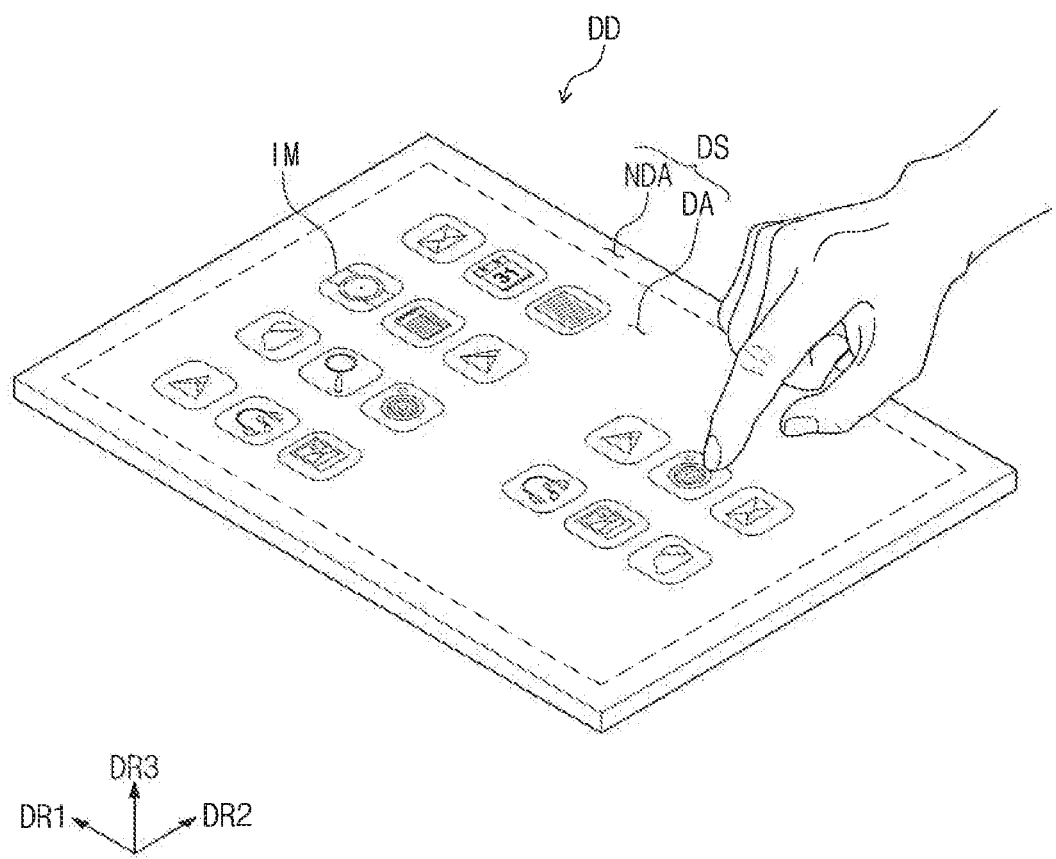
FIG. 1 is a perspective view illustrating a display device according to an embodiment of the present inventive concepts.

In this specification, it will also be understood that when one component (or region, layer, portion) is referred to as being 'on'. 'connected to', or 'coupled to' another component, it can be directly disposed/connected/coupled on/to the one component, or an intervening third component may also be present. When one component (or region, layer, portion) is referred to as being 'directly on', 'directly connected to', or 'directly coupled to' another component, no intervening third component may be present.

Like reference numerals may refer to like elements throughout. Also, in the figures, the thickness, ratio, and dimensions of components are exaggerated for clarity of illustration. The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, ""under", "below", "above', "upper", and the like are used for explaining relation association of components illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Hereinafter, embodiments of the inventive concept will be described in detail with reference to the accompanying drawings.

Figure 2:
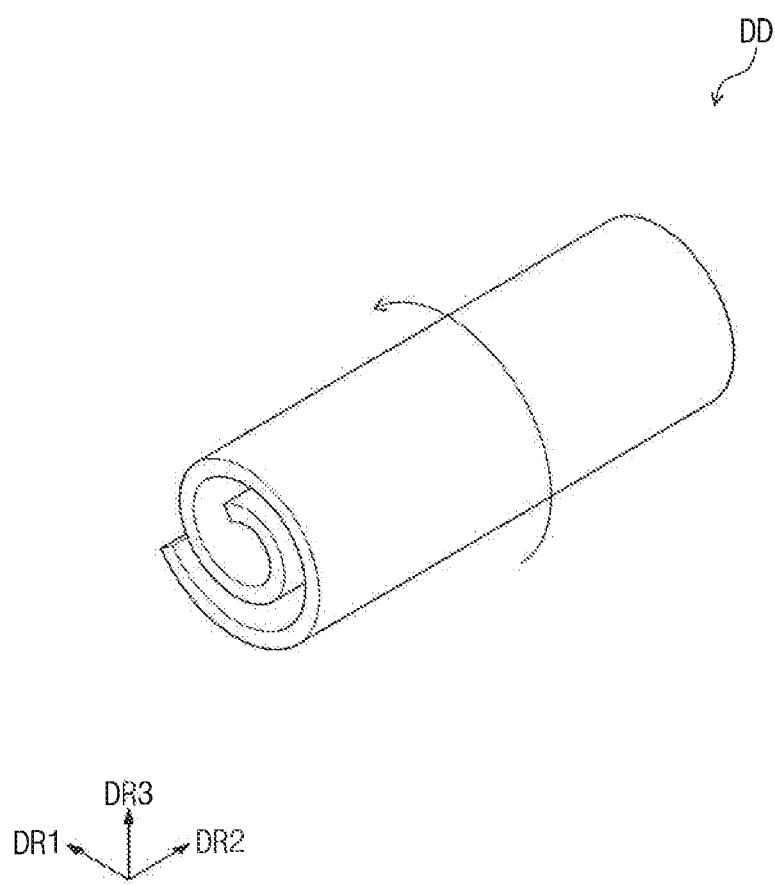
FIG. 2 is a perspective view illustrating a rolled state of the display device of FIG. 1 according to an embodiment of the present inventive concepts.

FIG. 1 is a perspective view illustrating a display device according to an embodiment of the inventive concept. FIG. 2 is a perspective view illustrating a rolled state of the display device in FIG. 1.

Referring to FIG. 1, a display device DD according to an embodiment of the present inventive concepts may have a rectangular shape having relatively long sides each extending in a first direction DR1 and relatively short sides each extending in a second direction DR2 crossing the first direction DR1. However, embodiments of the present inventive concepts are not limited thereto. For example, the display device DD may have various shapes such as a circular shape or a polygonal shape. While the first direction DR1 and the second direction DR2 are substantially perpendicular to each other in FIG. 1, the first direction DR1 and the second direction DR2 may cross each other at other angles.

Hereinafter, a direction that crosses a plane defined by the first and second directions DR1 and DR2 in a substantially perpendicular manner is defined as a third direction DR3. Also, in this specification, a feature of viewing on a plane is defined as a state when viewed in the third direction DR3.

A top surface of the display device DD may be defined as a display surface DS and have a plane defined by the first direction DR1 and the second direction DR2. Images IM generated from the display device DD may be provided to a user through the display surface DS. The images IM may be one or more moving and/or still images of various different subject matter.

The display surface DS may include a display area DA and a non-display area NDA around the display area DA. For example, as shown in the embodiment of FIG. 1, the non-display area NDA may completely surround the display area DA in the first and second directions DR1, DR2. The display area DA may display an image, and the non-display area NDA may not display an image. The non-display area NDA may define an edge of the display device DD, which surrounds the display area DA and is printed in a predetermined color. However, embodiments of the present inventive concepts are not limited thereto. For example, in some embodiments, one or more sides of the display area DA may define an edge of the display device DD and might not be surrounded by the non-display area NDA.

In an embodiment, the display device DD may be used in large-sized electronic devices such as a television, a monitor, or an outdoor advertisement board. Also, the display device DD may be used in small and medium-sized electronic devices such as a personal computer, a notebook computer, a personal digital terminal, a navigation unit for a vehicle, a game console, a smartphone, a tablet computer, and a camera. However, embodiments of the present inventive concepts are not limited thereto, and the display device DD may be used in other electronic devices.

Referring to FIG. 2, the display device DD may be a rollable flexible display device. For example, the display device DD may be a rollable display device.

For example, the display device DD may be rolled in the first direction DR1. However, embodiments of the present inventive concepts are not limited thereto. The display device DD may be rolled into a circular shape. In an embodiment, the user may roll the display device DD to carry the display device DD and may unroll the display device DD to watch an image generated on the display area DA. Thus, the rollable display device DD may provide increased portability.

Figure 3:
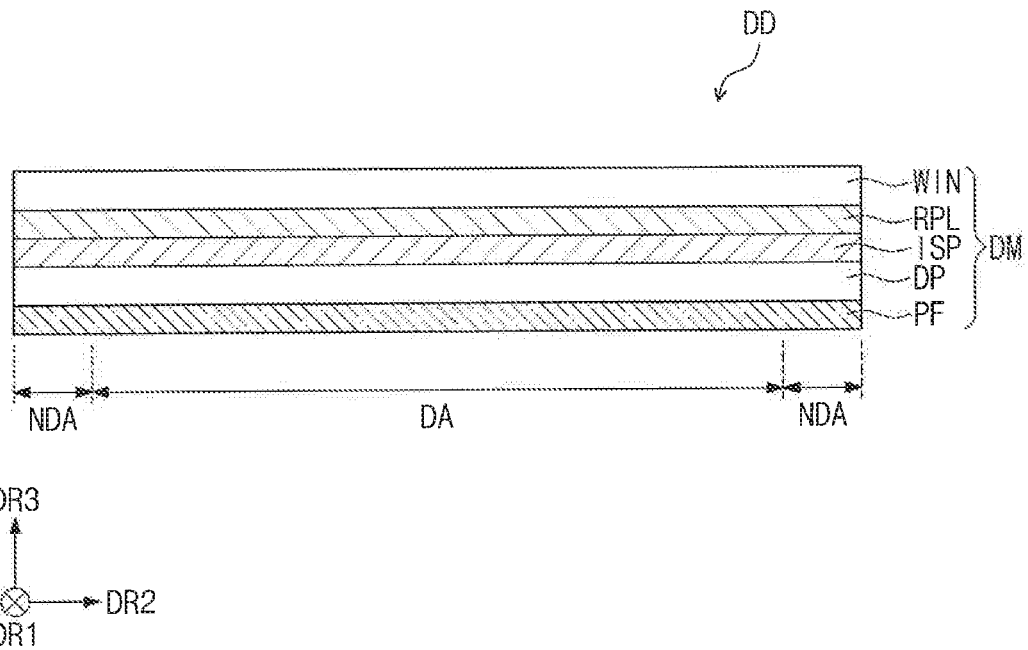
FIG. 3 is a cross-sectional view illustrating the display device of FIG. 1 according to an embodiment of the present inventive concepts.

FIG. 3 is a view exemplarily illustrating a cross-section of the display device in FIG. 1.

For example, a cross-section of the display device DD when viewed in the first direction DR1 is illustrated in FIG. 3.

Referring to FIG. 3, the display device DD may include a display module DM. The display device DD may include a module support part disposed below the display module DM, and a configuration of the module support part will be illustrated below in FIG. 6.

The display module DM may include a display panel DP, an input sensing part ISP, an anti-reflection layer RPL, a window WIN, and a panel protection film PF.

In an embodiment, the display panel DP may be a flexible display panel. The display panel DP according to an embodiment of the present inventive concepts may be a light emitting display panel. However, embodiments of the present inventive concepts are not limited thereto. For example, the display panel DP may be an organic light emitting display panel or an inorganic light emitting display panel. The organic light emitting display panel may include a light emitting layer containing an organic light emitting material. The inorganic light emitting display panel may include a light emitting layer containing a quantum dot or a quantum rod. Hereinafter, the display panel DP will be described as the organic light emitting display panel for convenience of explanation and not limitation.

The input sensing layer ISP may be disposed on the display panel DP. The input sensing part ISP may include a plurality of sensors for sensing an external input by a capacitive method. The input sensing part ISP may be manufactured directly on the display panel DP when the display panel DP is manufactured. However, embodiments of the present inventive concepts are not limited thereto. For example, in an embodiment, the input sensing part ISP may be manufactured as a panel separated from the display panel DP and then attached to the display panel DP by an adhesive layer.

The anti-reflection layer RPL may be disposed on the input sensing part ISP. The anti-reflection layer RPL may be provided directly on the input sensing part ISP or coupled to the input sensing part ISP by an adhesive layer. The anti-reflection layer RPL may be an external light reflection preventing film. The anti-reflection layer RPL may reduce a reflectance of external light incident to the display panel DP from above the display device DD.

When the external light traveling toward the display panel DP is reflected by the display panel DP and directed towards the user, the user may recognize the reflected light. In an embodiment, to prevent the above-described phenomenon, the anti-reflection layer RPL may include a plurality of color filters displaying the same color as pixels of the display panel DP.

In an embodiment, the color filters may filter the external light into the same color as the pixels. In this embodiment, the external light may not be recognized by the user. However, embodiments of the present inventive concepts are not limited thereto. For example, the anti-reflection layer RPL may include a polarizing film for reducing the reflectance of the external light. The polarizing film may include a retarder and/or a polarizer.

The window WIN may be disposed on the anti-reflection layer RPL. For example, the window WIN may be disposed directly on the anti-reflection layer RPL or coupled to the anti-reflection layer RPL by an adhesive layer. The window WIN may protect the display panel DP, the input sensing part ISP, and the anti-reflection layer RPL from external scratches and impacts.

The panel protection film PF may be disposed below the display panel DP. For example, the panel protection film PF may be disposed directly below the display panel DP or coupled to the display panel DP by an adhesive layer. The panel protection film PF may protect a lower portion of the display panel DP. In an embodiment, the panel protection film PF may include a flexible plastic material such as polyethyleneterephthalate (PET).

Figure 4:
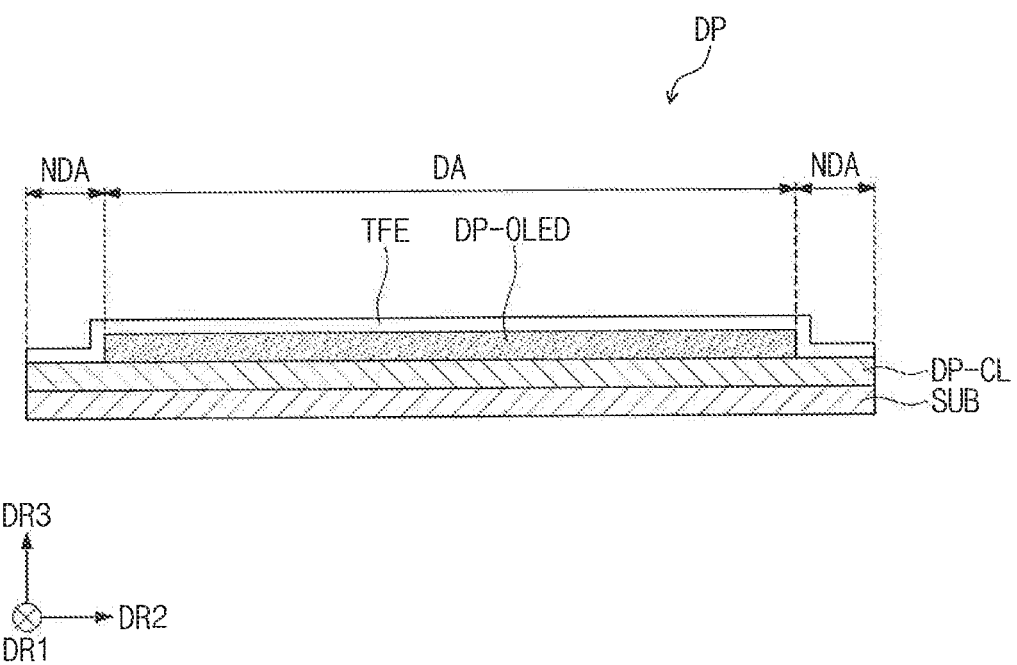
FIG. 4 is a cross-sectional view exemplarily illustrating the display panel of FIG. 3 according to an embodiment of the present inventive concepts.

FIG. 4 is a cross-sectional view exemplarily illustrating a cross-section of the display panel of FIG. 3.

For example, a cross-section of the display panel DP when viewed in the first direction DR1 is illustrated in FIG. 4.

Referring to FIG. 4, the display panel DP may include a substrate SUB, a circuit device layer DP-CL disposed on the substrate SUB (e.g., directly thereon in the third direction DR3), a display device layer DP-OLED disposed on the circuit device layer DP-CL (e.g., directly thereon in the third direction DR3), and a thin-film encapsulation layer TFE disposed on the display device layer DP-OLED and the circuit device layer DP-CL (e.g., disposed directly thereon).

The substrate SUB may include a display area DA and a non-display area NDA disposed around the display area DA. In an embodiment, the substrate SUB may include a flexible plastic material such as polyimide (PI). The display device layer DP-OLED may be disposed on the display area DA.

A plurality of pixels may be disposed on the display area DA. Each of the pixels may include a light emitting device connected to a transistor disposed on the circuit device layer DP-CL and disposed on the display device layer DP-OLED.

The thin-film encapsulation layer TFE may be disposed on the circuit device layer DP-CL to cover the display device layer DP-OLED. In an embodiment, the thin-film encapsulation layer TFE may include inorganic layers and an organic layer disposed between the inorganic layers. The inorganic layers may protect the pixels from moisture/oxygen. The organic layer may protect the pixels PX from foreign substances such as dust particles. However, embodiments of the present inventive concepts are not limited thereto and the thin-film encapsulation layer TFE may include at least one organic layer and at least one inorganic layer having various different numbers.

Figure 5:
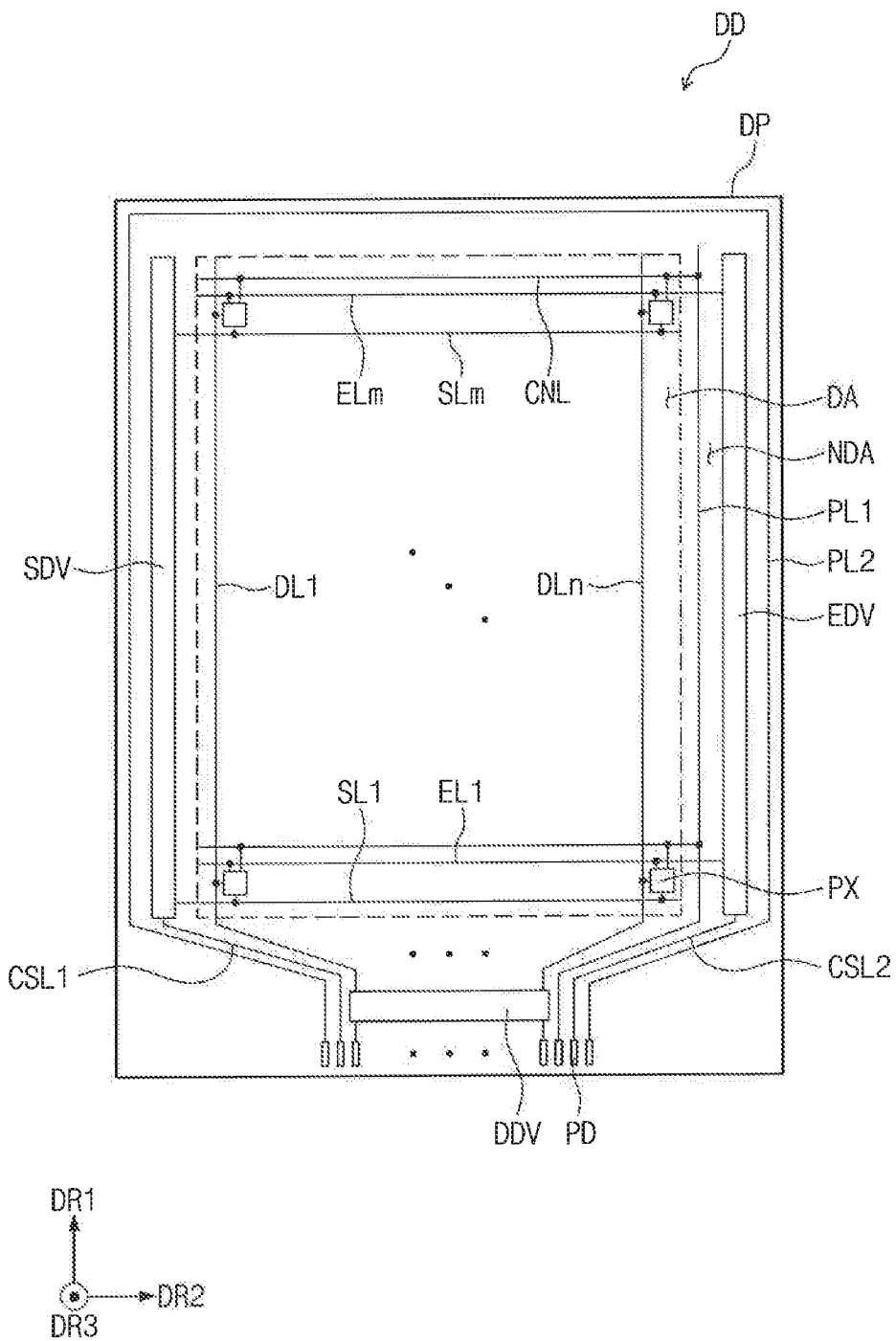
FIG. 5 is a plan view illustrating the display panel of FIG. 4 according to an embodiment of the present inventive concepts.

FIG. 5 is a plan view illustrating the display panel in FIG. 4.

Referring to FIG. 5, the display device DD may include a display panel DP, a scan driver SDV, a data driver DDV, an emission driver EDV, and a plurality of pads PD. The display panel DP may include a display area DA and a non-display area NDA surrounding the display area DA (e.g., in the first and second directions DR1, DR2).

The display panel DP may include a plurality of pixels PX, a plurality of scan lines SL1 to SLm, a plurality of data lines DL1 to DLn, a plurality of emission lines EL1 to Elm, first and second control lines CSL1 and CSL2, first and second power lines PL1 and P12, and connection lines CNL. Here, m and n are natural numbers.

The pixels PX may be disposed on the display area DA. In an embodiment, the scan driver SDV and the emission driver EDV may be disposed on the non-display areas NDA adjacent to the relatively long sides of the display panel DP, respectively. However, embodiments of the present inventive concepts are not limited thereto. The data driver DDV may be disposed on the non-display area NDA adjacent to one of the relatively short sides of the display panel DP. When viewed on a plane, the data driver DDV may be disposed adjacent to a lower end of the display panel DP (e.g., in the first direction DR1). However, embodiments of the present inventive concepts are not limited thereto.

As shown in the embodiment of FIG. 5, the scan lines SL1 to SLm may each extend in the second direction DR2 and be connected to the pixels PX and the scan driver SDV. The scan lines SL1 to SLm are arranged in the first direction DR1. The data lines DL1 to DLn may each extend in the first direction DR1 and be connected to the pixels PX and the data driver DDV. The data lines DL1 to DLn are arranged in the second direction DR2. The emission lines EL1 to ELm may each extend in the second direction DR2 and be connected to the pixels PX and the emission driver EDV. The emission lines EL1 to Elm are arranged in the first direction DR1.

The first power line PL may extend in the first direction DR1 and be disposed on the non-display area NDA. Although the embodiment shown in FIG. 5 includes the first power line PL1 disposed between the display area DA and the emission driver EDV (e.g., in the second direction DR2), embodiments of the present inventive concepts are not limited thereto. For example, the first power line PL1 may be disposed between the display area DA and the scan driver SDV.

The connection lines CNL may each extend in the second direction DR2 and be arranged in the first direction DR1. The connection lines CNL may be connected to the first power line PL1 and the pixels PX. A first voltage may be applied to the pixels PX through the first power line PL1 and the connection lines CNL, which are connected to each other.

The second power line PL2 may be disposed on the non-display area NDA. In an embodiment, the second power line PL2 may extend along the relatively long sides of the display panel DP and a relatively short side of the display panel DP, at which the data driver DDV is not disposed. For example, a shown in the embodiment of FIG. 5, the relatively short side of the display panel DP that the second power line PL2 is disposed on when viewed on the plane may be the upper side (e.g., in the first direction DR1). In an embodiment, the second power line PL2 may be disposed at an outer portion further (e.g., closer to an edge of the display device DD) than the scan driver SDV and the emission driver EDV.

In an embodiment, the second power line PL2 may extend toward the display area DA and be connected to the pixels PX. A second voltage having a level lower than the first voltage may be applied to the pixels PX through the second power line PL2.

The first control line CSL1 may be connected to the scan driver SDV and extend toward the lower end of the display panel DP (e.g., in the first direction DR1) when viewed on the plane. The second control line CSL2 may be connected to the emission driver EDV and extend toward the lower end of the display panel DP (e.g., in the first direction DR1) when viewed on the plane. The data driver DDV may be disposed between the first control line CSL1 and the second control line CSL2 (e.g., in the second direction DR2).

The pads PD may be disposed on the display panel DP. The pads PD may be disposed closer to the lower end of the display panel DP (e.g., the lower edge of the display panel DP in the first direction DR1) than the data driver DDV. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

In an embodiment, the display device DD may further include a timing controller for controlling an operation of each of the scan driver SDV, the data driver DDV, and the emission driver EDV and a voltage generation part for generating the first and second voltages. The timing controller and the voltage generation part may be connected to the corresponding pads PD through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

The pixels PX may receive the data voltages in response to the scan signals. The pixels PX may display an image by emitting light having luminance corresponding to the data voltages in response to the emission signals. The pixels PX may have an emission time that is controlled by the emission signals.

In an embodiment, the display panel DP may be rolled in the first direction DR1. For example, the display panel DP may be rolled from a first side of the display panel DP (e.g., a relatively short side disposed on the lower side in the plane view), which is adjacent to the data driver DDV. However, embodiments of the present inventive concepts are not limited thereto. For example, the display panel DP may be rolled from a second side of the display panel DP (e.g., a relatively short side disposed on the upper side in the plane view), which is opposite to the first side of the display panel DP.

Figure 6:
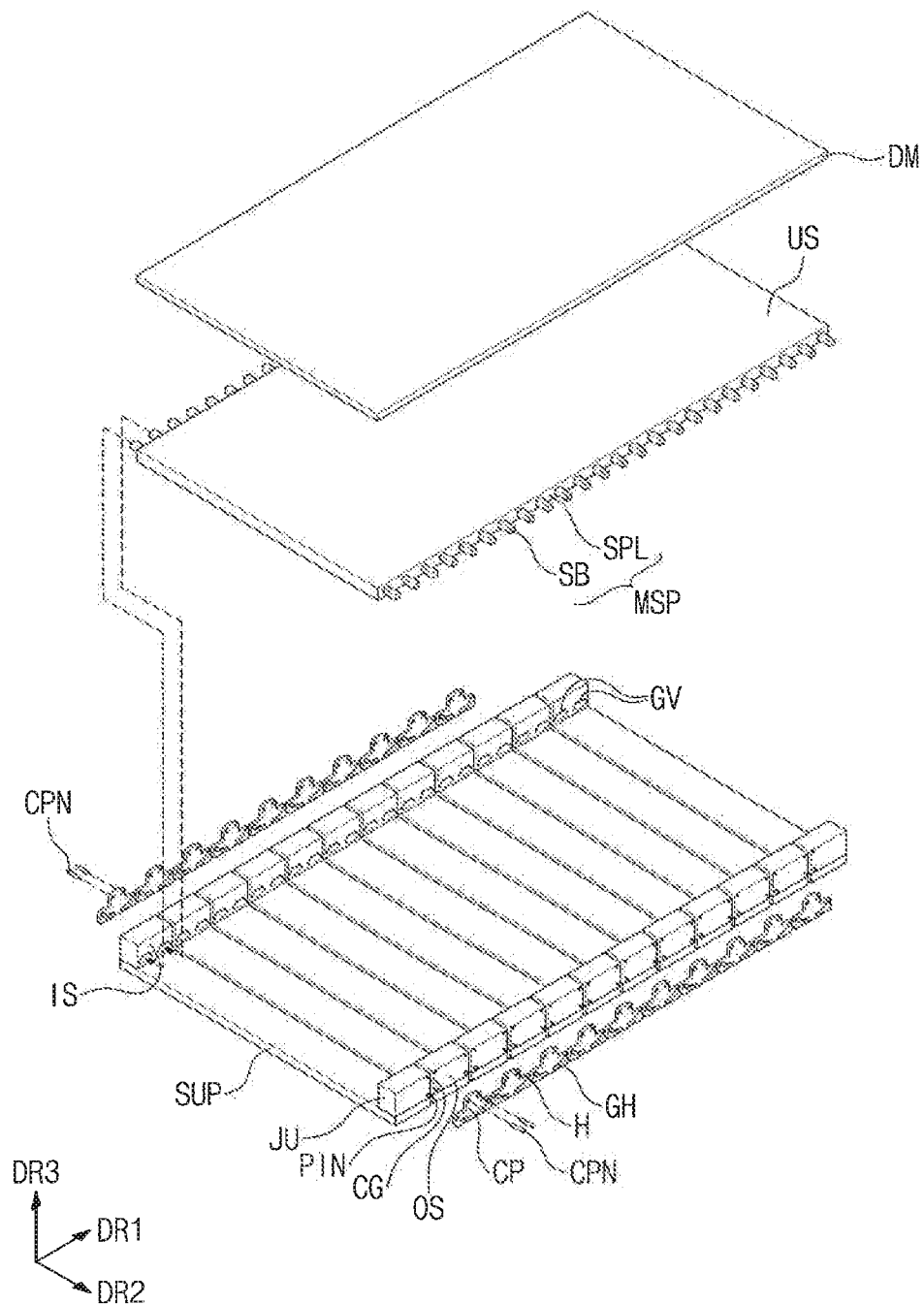
FIG. 6 is an exploded perspective view illustrating the display device of FIG. 1 according to an embodiment of the present inventive concepts.

FIG. 6 is an exploded perspective view illustrating the display device in FIG. 1.

Referring to FIG. 6, the display device DD according to an embodiment of the present inventive concepts may include a display module DM, a module support part MSP, a plurality of joints JU, a plurality of support parts SUP, and a plurality of connection parts CP.

Although the display module DM may have a rectangular shape having relatively long sides extending in the first direction DR1 and relatively short sides extending in the second direction DR2, embodiments of the present inventive concepts are not limited to the shape of the display module DM.

In an embodent, the module support part MSP may extend further in the first direction DR1 than the second direction DR2. For example, the module support part MSP may have a rectangular shape having relatively long sides extending in the first direction DR1 and relatively short sides extending in the second direction DR2. However, embodiments of the present inventive concepts are not limited thereto and the shape of the module support part MSP may vary. The module support part MSP may be disposed below the display module DM (e.g., in the third direction DR3) to support the display module DM.

As shown in the embodiment of FIG. 6, the module support part MSP may include a support layer SPL and a plurality of support bars SB protruding to both opposite sides of the support layer SPL. For example, in an embodiment, the support bars SB may protrude in the second direction DR2 from first and second sides of the support layer SPL. The first and second sides of the support layer SPL may be relatively long sides of the support layer SPL that extend in the first direction DR1 and are opposite to each other in the second direction DR2. The support layer SPL and the support bars SB may be disposed below the display module DM (e.g., in the third direction DR3).

The display module DM may be disposed on a top surface US of the support layer SPL. For example, in an embodiment, the display module DM may be disposed directly on a top surface US of the support layer SPL (e.g., in the third direction DR3). The top surface US of the support layer SPL may have a plane defined by the first and second directions DR1 and DR2. The display module DM may be attached to the top surface US, which is a flat surface, of the support layer SPL.

The support bars SB may extend from each of the first and second sides of the support layer SPL in the second direction DR2 and be arranged in the first direction DR1. Each of the support bars SB may have first and second ends that are opposite to each other in the second direction DR2 which are disposed outside the support layer SPL. Although each of the support bars SB may have a rectangular column shape having relatively long sides extending in the second direction DR2, embodiments of the present inventive concepts are not limited thereto and the shape of each of the support bars SB may vary.

The joints JU may be spaced apart from each other in the second direction DR2 and arranged in the first direction DR1. The joints JU may be arranged in the first direction DR1 along both sides of the support layer SPL. For example, the joints JU may be disposed along the opposing relatively long sides of the support layer which extend in the first direction DR1. Although the embodiment of FIG. 6 shows the joints JU spaced by a uniform gap from each other in the first direction DR1, embodiments of the present inventive concepts are not limited thereto and the gap between the joints JU may vary.

The support bars SB protruding from the support layer SPL may be inserted into and connected to the joints JU. For example, a plurality of grooves GV may be defined in the joints JU. The plurality of grooves GV may receive the first and second ends of the support bars SB which extend outside of the support layer SPL. The grooves GV may be defined in inner surfaces IS of the joints JU, which face each other in the second direction DR2.

The support bars SB are inserted into the grooves GV for connection to the joints JU. Thus, the module support part MSP may be connected to the joints JU by the support bars SB.

The joints JU may be coupled to rotate with respect to each other. For example, as the connection parts CP are connected to the joints JU, the joints JU may be coupled to each other and the coupled joints JU may rotate with respect to each other. The connection parts CP may be connected to the joints JU arranged in the first direction DR1.

The connection parts CP may be connected to outer surfaces OS of the joints JU, which are disposed opposite to each other in the second direction DR2. As shown in the embodiment of FIG. 6, the outer surface OS of each of the joints JU may be a surface opposite (e.g., in the second direction DR2) to the inner surface IS of each of the joints JU.

A coupling groove CG may be defined in an upper end of the outer surface OS of each of the joints JU. As shown in the embodiment of FIG. 6, a pin PIN may protrude from a lower end of the outer surface OS of each of the joints JU. In an embodiment, the pin PIN may be integrated with the joint JU, or separately manufactured and connected to the outer surface OS of the joint JU. In an embodiment, the coupling groove CG and the pin PIN may be disposed adjacent to edges of the joints JU, which are adjacent to each other in the first direction DR1. However, embodiments of the present inventive concepts are not limited thereto and the coupling groove CG and pin PIN may be variously arranged.

A plurality of holes H and a plurality of guide holes GH may be defined in each of the connection parts CP. In an embodiment, the holes H may be adjacent to upper ends of the connection parts CP, and the guide holes GH may be adjacent to lower ends of the connection parts CP. However, embodiments of the present inventive concepts are not limited thereto. In an embodiment, each of the guide holes GH may have a curved shape. However, embodiments of the present inventive concepts are not limited thereto.

Coupling pins CPN may be inserted into the coupling grooves CG of the joints JU and the holes H of the connection parts CP, to connect the connection parts CP to the joints JU. Although four coupling pins CPN are illustrated as an example in the embodiment shown in FIG. 6, embodiments of the present inventive concepts are not limited thereto. The coupling pins CPN inserted into all of the coupling grooves CG and the holes H may be substantially provided to the joints JU and the connection parts CP.

The pins PIN may be inserted into the guide holes GH and move along the guide holes GH. A configuration of the connection parts CP coupled to the joints JU will be described in more detail below with reference to FIGS. 11A and 11B.

The support parts SUP may each extend in the second direction DR2 and be arranged in the first direction DR1. Although the embodiment in FIG. 6 shows the support parts SUP spaced apart from each other by a uniform gap in the first direction DR1, embodiments of the present inventive concepts are not limited thereto and the gap between the support parts SUP may vary. A top surface of each of the support parts SUP may have a plane defined by the first and second directions DR1 and DR2.

The support parts SUP may be disposed below the joints JU (e.g., in the third direction DR3). For example, a lower surface of the joints JU may directly contact an upper surface of the support parts SUP. The support parts SUP may be disposed below the support layer SPL and the support bars SB (e.g., in the third direction DR3).

The joints JU may be disposed adjacent to first and second sides of the support parts SUP, which are opposite to each other in the second direction DR2. The joints JU may be disposed on the support parts SUP. For example, as shown in the embodiment of FIG. 6, each support part of the supports parts SUP may have a substantially rectangular shape having relatively long sides extending in the second direction DR2 and relatively short sides extending in the first direction DR1. The joints JU may be disposed on the opposite first and second sides which are formed by the relatively short sides of the support parts SUP which extend in the first direction DR1. In an embodiment, one pair of joints JU that face each other in the second direction may be disposed on a corresponding support part SUP among the support parts SUP.

In an embodiment, each of the joints JU and the support parts SUP may have a relatively rigid structure. For example, each of the joints JU and the support parts SUP may include a metal such as aluminum. However, embodiments of the present inventive concepts are not limited thereto. For example, each of the joints JU and the support parts SUP may include a plastic material, etc.

Figure 7:
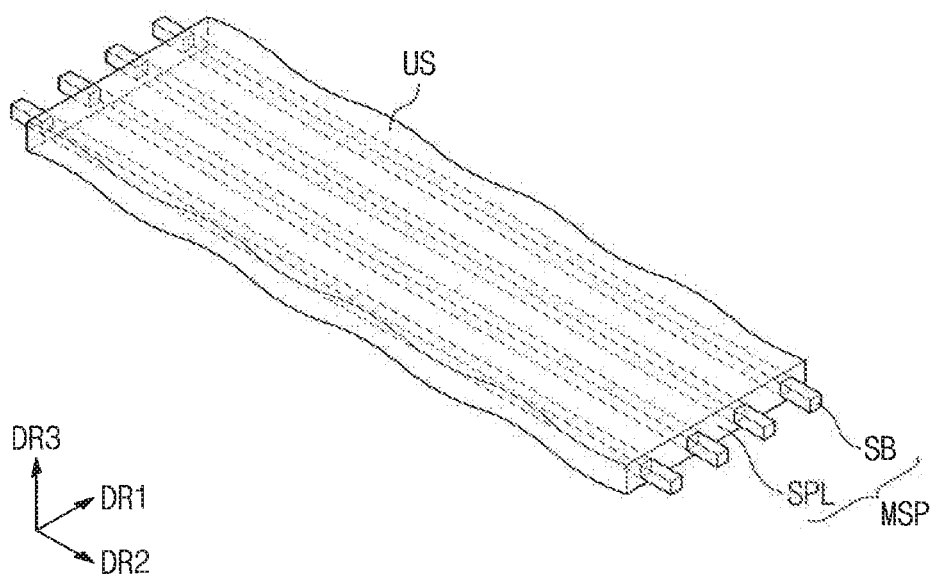
FIG. 7 is an enlarged perspective view illustrating a portion of a module support part of FIG. 6 according to an embodiment of the present inventive concepts.

FIG. 7 is an enlarged perspective view illustrating a portion of the module support part in FIG. 6.

Referring to FIG. 7, the module support part MSP may include a support layer SPL and a plurality of support bars SB disposed in the support layer SPL. The support bars SB may each extend in the second direction DR2 and be arranged in the first direction DR1. In an embodiment, the support bars SB may each extend from the inside of the support layer SPL to the outside of the support layer SPL. The first and second ends of each of the support bars SB, which are opposite to each other in the second direction DR2, may extend farther in the second direction DR2 than the support layer SPL to be disposed outside the support layer SPL.

For example, the support bars SB disposed inside of the support layer SPL is illustrated by a dotted line in FIG. 7. Although the embodiment of FIG. 7 shows the support bars SB spaced by a uniform gap from each other in the first direction DR1, embodiments of the present inventive concepts are not limited thereto and the gap between the support bars SB may vary.

Each of the support bars SB may be relatively rigid. For example, each of the support bars SB may include metal. In an embodiment, each of the support bars SB may include aluminum, stainless, or invar. However, embodiments of the present inventive concepts are not limited thereto. For example, each of the support bars SB may include carbon fiber reinforced plastic.

In an embodiment, the support layer SPL may include elastic polymer having a predetermined elastic force. For example, in an embodiment, the support layer SPL may include at least one material selected from thermoplastic polyurethane, silicone, thermoplastic rubbers, elastolefin, thermoplastic olefin, polyamide, polyether block amide, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomers, or ethylene-vinyl acetate.

Each of the support bars SB may have a modulus (e.g., a bending modulus) greater than the support layer SPL. For example, in an embodiment, the support layer SPL may have a modulus in a range of about 20 KPa to about 20 MPa. In an embodiment, each of the support bars SB may have a modulus in a range of about 1 GPa to about 200 GPa. The support layer SPL and the support bars SB may support the display module DM.

In a comparative embodiment in which the support bars SB are attached to a bottom surface of the display module DM and supports the display module DM without using the support layer SPL, the display module DM may be deformed in a space between the support bars SB. For example, when the display module DM is repeatedly rolled and unrolled, a portion of the display module DM, which overlaps the space between the support bars SB, may be stretched and deflected downward. This deformation may cause a wrinkle shape that is recognized from the outside. That is, a surface quality of the display module DM may be degraded.

In an embodiment of the present inventive concepts, the support bars SB having a greater rigidity (e.g., a relatively higher modulus) may support the display module DM, and the support layer SPL having a predetermined elasticity (e.g., a relatively lower modulus) may provide the flat top surface US to the display module DM. Since the display module DM is attached to the flat top surface US of the support layer SPL, the portion of the display module DM, which overlaps the space between the support bars SB, may maintain a flat state instead of being deformed. That is, the display module DM may have an increased surface quality.

FIGS. 8A to 8D are views illustrating various embodiments of the support bars in FIG. 7.

For example, FIGS. 8A to 8D are side views when viewed in the second direction DR2.

Although each of the support bars SB may have a rectangular shape when viewed in the second direction DR2, embodiments of the present inventive concepts are not limited to the shape of each of the support bars SB.

Figure 8A:
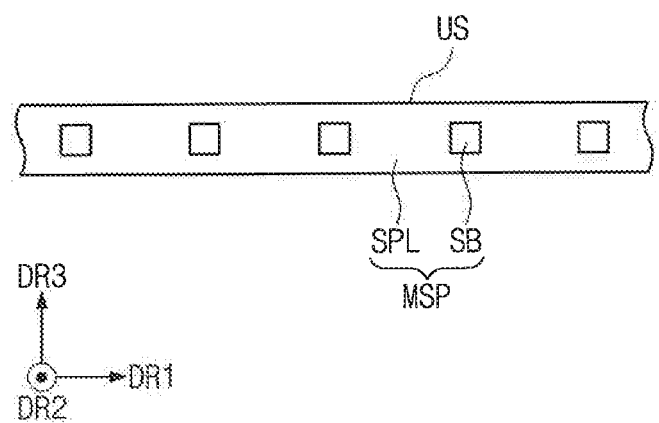
FIGS. 8A to 8D are side views illustrating support bars of FIG. 7 according to embodiments of the present inventive concepts.
Figure 8B:
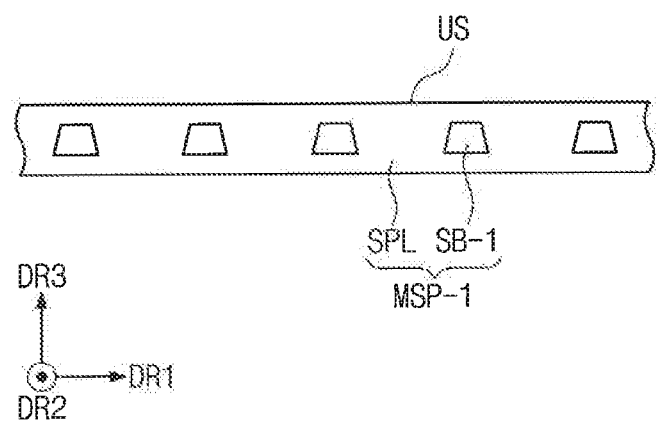
Figure 8C:
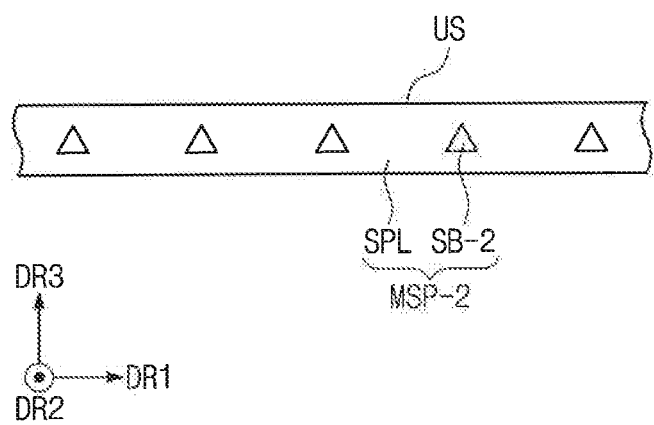
Figure 8D:
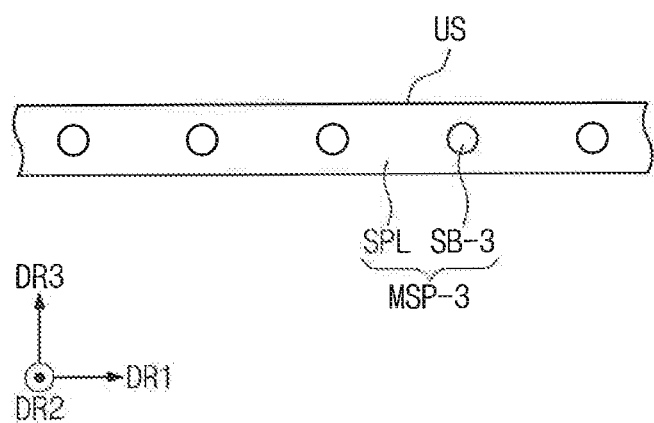

For example, as illustrated in FIGS. 8B to 8D, each of the support bars SB may have various shapes such as a trapezoidal shape, a triangular shape, and a circular shape when viewed in the second direction DR2. Additionally, while the respective shapes of each of the support bars SB in the support layer SPL of the embodiments shown in FIGS. 8B to 8D are uniform, embodiments of the present inventive concepts are not limited thereto.

Figure 9:
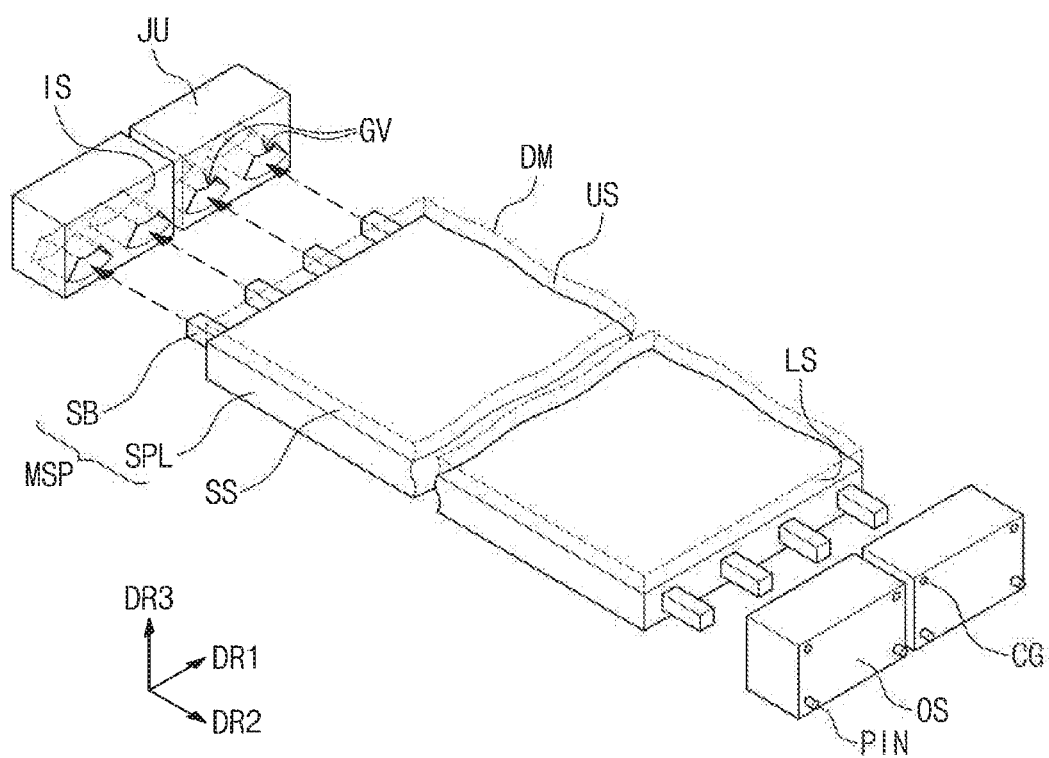
FIG. 9 is an enlarged perspective view illustrating a portion of support bars and a portion of joints of FIG. 6 according to an embodiment of the present inventive concepts.

FIG. 9 is an enlarged view illustrating a portion of the support bars and a portion of the joints in FIG. 6.

For example, the display module DM disposed on the support layer SPL is illustrated by a dotted line in FIG. 9.

Referring to FIG. 9, the display module DM may be disposed on the support layer SPL, and the display module DM may be attached to the top surface US of the support layer SPL. For example, the display module DM may be attached to the top surface US of the support layer SPL by an adhesive. However, embodiments of the present inventive concepts are not limited thereto.

The pair of joints JU may be spaced apart from each other with the support bars SB therebetween in the second direction DR2 and arranged in the first direction DR1. The support layer SPL and the support bars SB may be disposed between the pair of joints JU that are spaced apart from each other in the second direction DR2.

The first and second ends of each of the support bars SB which are opposite to each other in the second direction DR2 may be inserted into the pair of joints JU. The first and second ends of each of the support bars SB may be inserted into the grooves GV in the pair of joints JU. At least a portion of the support bars SB disposed outside the support layer SPL may be inserted into the grooves GV. The first and second ends of each of the support bars SB may move along the grooves GV.

At least two support bars SB may be inserted into one pair of joints arranged in the second direction DR2. Although a structure in which first and second ends of two support bars SB are inserted into one pair of joints JU is illustrated as an example, embodiments of the present inventive concepts are not limited to the number of the support bars SB inserted into the one pair of joints JU.

In an embodiment, at least two grooves GV may be defined in each of the joints JU. First ends or second ends of two adjacent support bars SB (e.g., in the first direction DR1) may be inserted into the two grooves GV in each joint JU. The grooves GV defined in each of the joints JU may be varied according to the number of the support bars SB inserted into the joints JU.

The first and second ends of the two support bars SB may be inserted into the grooves GV defined in one pair of joints JU arranged in the second direction DR2. Thus, the first and second ends of the at least two support bars SB may be supported by the one pair of joints JU arranged in the second direction DR2.

Hereinafter, one side of the display module DM in parallel to the second direction DR2 is defined as a minor axis SS, and the other side of the display module DM in parallel to the first direction DR1 is defined as a major axis LS.

Since the support bars SB each extend in the second direction DR2, the support bars SB may easily support the display module DM with respect to the minor axis SS. However, since the support bars SB are spaced apart from each other in the first direction DR1, the support bars SB may have a weak supporting force with respect to the major axis LS of the display module DM.

Since at least two support bars SB are connected to one pair of joints JU to support the display module DM together with the one pair of joints JU, the supporting force with respect to the major axis LS of the display module DM may increase.

Figure 10A:
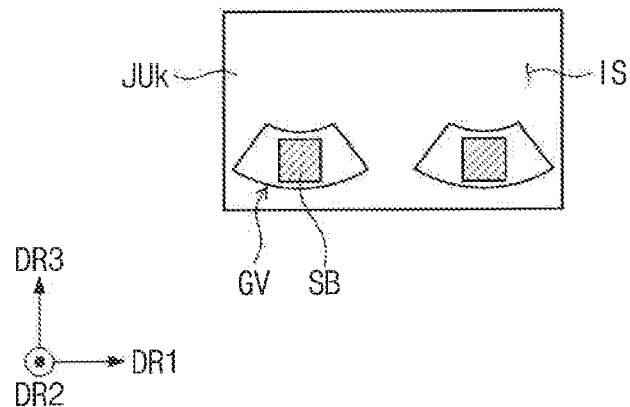
FIGS. 10A, 10B, and 10C are side views illustrating various embodiments of grooves of FIG. 9 according to embodiments of the present inventive concepts.
Figure 10B:
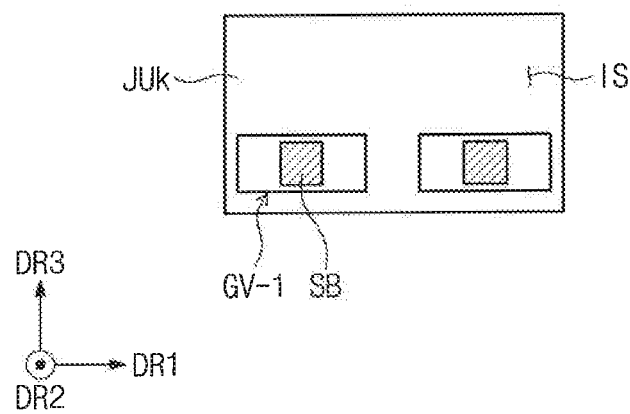
Figure 10C:
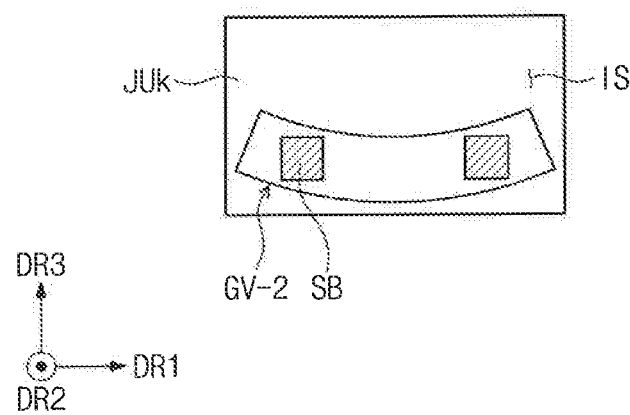

FIGS. 10A, 10B, and 10C are views illustrating various embodiments of the grooves in FIG. 9.

For example, FIGS. 10A to 10C illustrate an inner surface IS of a k-th joint JUk when viewed in the second direction DR2 together with first ends of two support bars SB.

Referring to FIG. 10A, first ends of at least two support bars SB may be inserted into at least two grooves GV, respectively, defined in the inner surface IS of the k-th joint JUk. Here, k is a natural number.

As shown in the embodiment of FIG. 10A, the grooves GV may be arranged in the first direction DR1 and each have a curved shape. For example, each of the grooves GV may have a curved shape that is downwardly convex (e.g., in the third direction DR3). However, embodiments of the present inventive concepts are not limited to the shape of the grooves GV and the curved shape of the grooves GV may vary. Although the grooves GV may have the same shape, embodiments of the present inventive concepts are not limited thereto. For example the grooves GV may have different shapes with respect to each other.

Referring to FIG. 10B, at least two grooves GV-1 defined in the inner surface IS of the k-th joint JUk may be arranged in the first direction DR1 and each has a linear shape extending in the first direction DR1. For example, as shown in the embodiment of FIG. 10B, the at least two grooves GV-1 may have a substantially rectangular shape. However, embodiments of the present inventive concepts are not limited thereto and the linear shape of the at least two grooves GV-1 may vary. First ends of the support bars SB may be inserted into the grooves GV-1 each having a linear shape, respectively.

Referring to FIG. 10C, a single groove GV-2 may be defined in the inner surface IS of the k-th joint JUk. The single groove GV-2 may have a curved shape. For example, the groove GV-2 may have a curved shape that is downwardly convex (e.g., in the third direction DR3). However, embodiments of the present inventive concepts are not limited thereto. For example, as illustrated in FIG. 10B, the single groove GV-2 may have a linear shape extending in the first direction DR1. First ends of at least two support bars SB may be inserted into the single groove GV-2.

Figure 11A:
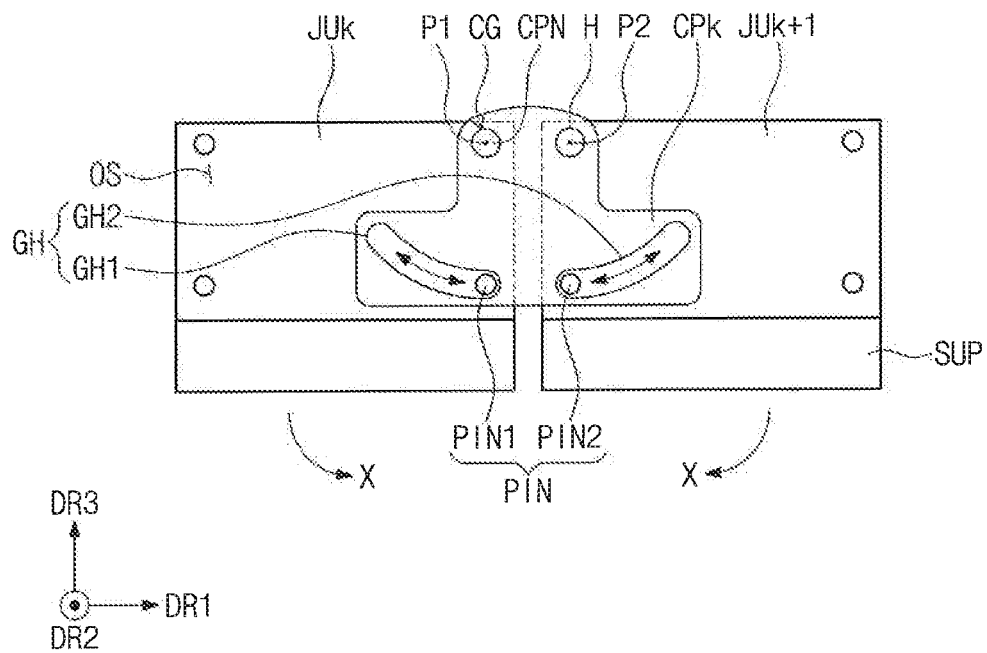
FIGS. 11A and 11B are side views illustrating a k-th joint and a k+1 joint, which are connected by a k-th connection part, among connection parts and joints in FIG. 6 according to embodiments of the present inventive concepts.
Figure 11B:
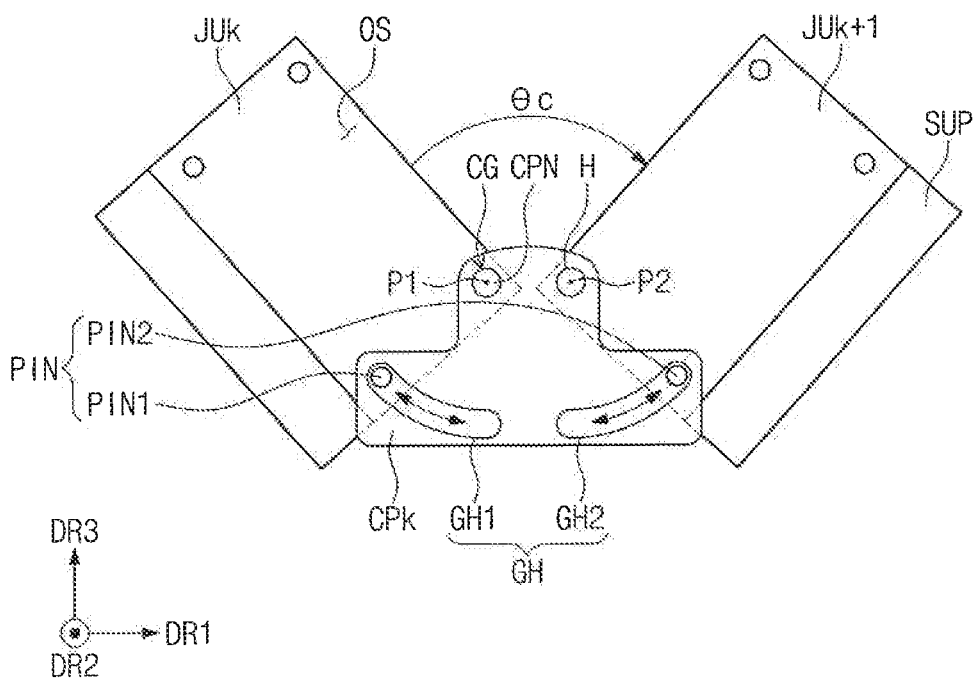

FIGS. 11A and 11B are views illustrating a k-th joint and a (k+1)-th joint, which are connected by a k-th connection part, among the connection parts and the joints in FIG. 6.

For example, side surfaces of a k-th connection part CPk, a k-th joint JUk, and a (k+1)-th joint JUk+1 when viewed in the second direction DR2 are illustrated in FIGS. 11A and 11B.

Referring to FIGS. 11A and 11B, the k-th connection part CPk may couple the k-th joint JUk and the (k+1)-th joint JUk+1, which are arranged in the first direction DR1 so that the k-th joint JUk and the (k+1)-th joint JUk+1 rotate with respect to each other.

For example, a plurality of coupling pins CPN may be inserted into holes H defined in the k-th connection part CPk and coupling grooves CG defined in the k-th joint JUk and the (k+1)-th joint JUk+1. For example, one coupling pin CPN may extend through one hole H of the k-th connection part CPk and the coupling groove CG of the k-th joint JUk and the (k+1)-th joint JUk+1 overlapping the one hole H (e.g., in the second direction DR2). The k-th connection part CPk may be connected to the k-th joint JUk and the (k+1)-th joint JUk+1 by the coupling pins CPN. Thus, the k-th joint JUk and the (k+1)-th joint JUk+1 may be connected to each other by the k-th connection part CPk.

In an embodiment, each of the coupling pins CPN may have a cylindrical shape extending longitudinally in the second direction DR2. Portions of the k-th joint JUk and the (k+1)-th joint JUk+1, in which the coupling pins CPN are disposed, may be defined as a first point P1 and a second point P2, respectively. The k-th connection part CPk may be connected to the first point P1 and the second point P2, and each of the first point PI and the second point P2 may define a rotation axis.

In an embodiment, the first point PI may be adjacent to an upper end of the k-th joint JUk (e.g., in the third direction DR3) and one side of the k-th joint JUk adjacent to the (k+1)-th joint JUk+1. For example, as shown in the embodiment of FIG. 11A, the first point P1 may be adjacent to an upper end of the k-th joint JUk (e.g., in the third direction DR3) and the right side of the k-th joint JUk (e.g., in the first direction DR1) that is adjacent to the (k+1)-th joint JUk+1. The second point P2 may be adjacent to an upper end of the (k+1)-th joint JUk+1 and one side of the (k+1)-th joint JUk+1 adjacent to the k-th joint JUk. For example, as shown in the embodiment of FIG. 11A, the second point P2 may be adjacent to an upper end of the (k+1)-th joint JUk+1 and a left side of the (k+1)-th joint JUk+1 (e.g., in the first direction DR1) that is adjacent to the k-th joint JUk. The k-th joint JUk and the (k+1)-th joint JUk+1 may rotate around the first point P1 and the second point P2, respectively.

The k-th connection part CPk may control a folded angle between the k-th joint JUk and the (k+1)-th joint JUk+1 through the guide holes GH by limiting the folded angle to a predetermined folded angle range. For example, the pins PIN may include a first pin PIN1 protruding from an outer surface OS of the k-th joint JUk and a second pin PIN2 protruding from an outer surface OS of the (k+1)-th joint JUk+1.

The first pin PIN1 may be adjacent to a lower end of the k-th joint JUk (e.g., in the third direction DR3) and one side of the k-th joint JUk adjacent to the (k+1)-th joint JUk+1. For example, as shown in the embodiment of FIG. 11A, the first pin PIN1 may be adjacent to a lower end of the k-th joint JUk and right side of the k-th joint JUk (e.g., in the first direction DR1) that is adjacent to the (k+1)-th joint JUk+1. The second pin PIN2 may be adjacent to a lower end of the (k+1)-th joint JUk+1 (e.g., in the third direction DR3) and one side of the (k+1)-th joint JUk+1 adjacent to the k-th joint JUk. For example, as shown in the embodiment of FIG. 11A, the second pin PIN2 may be adjacent to a lower end of the (k+1)-th joint JUk+1 and a left side of the (k+1)-th joint JUk+1 (e.g., in the first direction DR1) that is adjacent to the k-th joint JUk. However, embodiments of the present inventive concepts are not limited thereto and the positions of the first and second pins PIN1 and PIN2 may vary.

In an embodiment, the guide holes GH defined in the k-th connection part CPk may include a first guide hole GH1 and a second guide hole GH2, which have curved shapes symmetrical to each other in the first direction DR1. When viewed in the second direction DR2, the first guide hole GH1 may overlap the k-th joint JUk, and the second guide hole GH2 may overlap the (k+1)-th joint JUk+1.

For example, in an embodiment, each of the first guide hole GH1 and the second guide hole GH2 may have a curved shape corresponding to a circumference of a 1/N circle. The first guide hole GH1 may extend in a curved line from a lower end of the k-th connection pan CPk (e.g., in the third direction DR3) to a left upper end of the k-th connection part CPk (e.g., in the first direction DR1). The second guide hole GH2 may extend in a curved line from a lower end of the k-th connection part CPk (e.g., in the third direction DR3) to a right upper end of the k-th connection part CPk (e.g., in the first direction DR1).

The first pin PIN1 may be inserted into the first guide hole GH1. In a state in which the k-th joint JUk and the (k+1)-th joint JUk+1 are unfolded, the first pin PIN1 may be disposed at an end of the first guide hole GH1, which is adjacent to the lower end of the k-th connection part CPk.

The second pin PIN2 may be inserted into the second guide hole GH2. In a state in which the k-th joint JUk and the (k+1)-th joint JUk+1 are unfolded, the second pin PIN2 may be disposed at an end of the second guide hole GH2, which is adjacent to the lower end of the k-th connection part CPk.

The k-th joint JUk and the (k+1)-th joint JUk+1 may rotate around the first point P1 and the second point P2 and be folded with each other. As shown in the embodiment of FIG. 11B, the k-th joint JUk may rotate around the first point PI in a clockwise direction, and the (k+1)-th joint JUk+1 may rotate around the second point P2 in a counterclockwise direction.

A folded angle range between the k-th joint JUk and the (k+1)-th joint JUk+1 may be determined by the first and second pins PIN1 and PIN2 moving along the first and second guide holes GH1 and GH2. The folded angle range may be predetermined by the shapes of the first and second guide holes GH1 and GH2.

For example, in an embodiment, the k-th joint JUk may rotate in a predetermined folded angle range of about 0° to about 45° with respect to the first point P1 by the first pin PIN1 moving along the first guide hole GH1. The (k+1)-th joint JUk+1 may rotate in a predetermined folded angle range of about 0° to about 45° with respect to the second point P2 by the second pin PIN2 moving along the second guide hole GH2.

In an embodiment, the maximum angle of rotation of each of the k-th joint JUk and the (k+1)-th joint JUk+1 may be about 45° according to movement of the first and second pins PIN1 and PIN2. When the first and second pins PIN1 and PIN2 move to upper ends of the first and second guide holes GH1 and GH2, respectively, a folded angle θc between the k-th joint JUk and the (k+1)-th joint JUk+1 may be maximized. As shown in the embodiment of FIG. 11B, the k-th joint JUk and the (k+1)-th joint JUk+1 may have a maximum folded angle θc of about 90°.

Although the maximum folded angle between the k-th joint JUk and the (k+1)-th joint JUk+1 in the embodiment shown in FIG. 11B is about 90°, embodiments of the present inventive concepts are not limited thereto. For example, each of the first and second guide holes GH1 and GH2 may have a curved shape having a length less than that of the curved shape in FIGS. 11A and 11B. In this embodiment, since the k-th joint JUk and the (k+1)-th joint JUk+1 rotate less, the maximum folded angle between the k-th joint JUk and the (k+1)-th joint JUk+1 may be greater than about 90°.

In an embodiment, each of the first and second guide holes GH1 and GH2 may have a curved shape having a length greater than that of the curved shape shown in the embodiments of FIGS. 11A and 11B. In this embodiment, since the k-th joint JUk and the (k+1)-th joint JUk+1 rotate more, the maximum folded angle between the k-th joint JUk and the (k+1)-th joint JUk+1 may be less than about 90°.

When the k-th joint JUk and the (k+1)-th joint JUk+1 are unfolded, the first pin PIN1 and the second pin PIN2 may be disposed at the ends of the first guide hole GH1 and the second guide hole GH2 that are adjacent to the lower end of the k-th connection part CPk. Thus, the k-th joint JUk and the (k+1)-th joint JUk+1 may not rotate in a reverse direction. For example, the k-th joint JUk may not rotate in the counterclockwise direction, and the (k+1)-th joint JUk+1 may not rotate in the clockwise direction.

Figure 12:
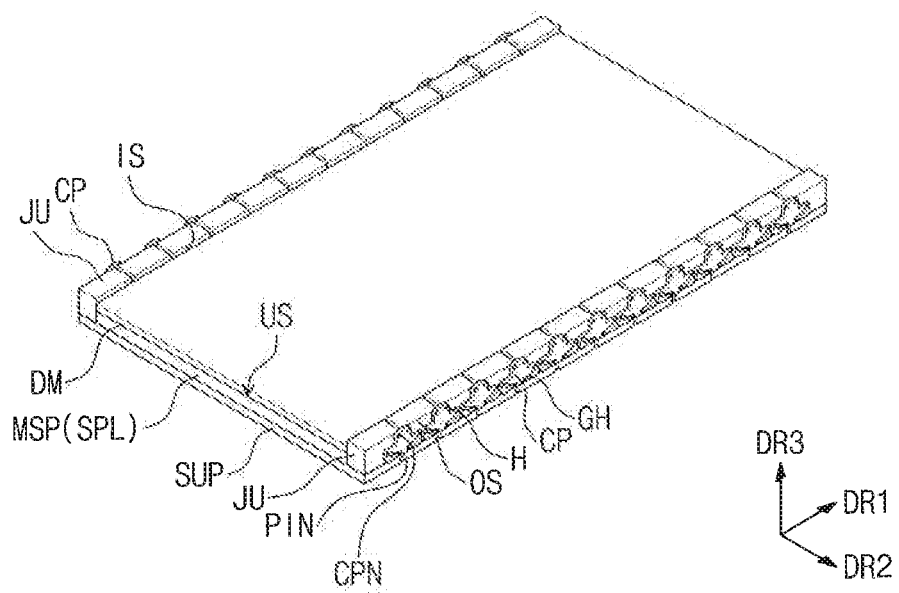
FIG. 12 is a perspective view illustrating a state in which the display module and the module support part of FIG. 6 are coupled to the joints and the support parts according to an embodiment of the present inventive concepts.

FIG. 12 is a perspective view illustrating a state in which the display module and the module support part in FIG. 6 are coupled to the joints and the support parts.

Hereinafter, FIGS. 6, 9, 11A and 11B are described together as necessary for explanation.

Referring to FIGS. 6, 9, and 12, as the display module DM is attached to the top surface US of the module support part MSP, and the first and second ends of the support bars SB are inserted into the grooves GV, the module support part MSP may be connected to the joints JU. The support layer SPL may be disposed on the support parts SUP (e.g., directly thereon in the third direction DR3).

The support layer SPL and the display module DM may be accommodated in (e.g., disposed in) the space defined between the support parts SUP and the opposing pairs of joints JU. For example, the support layer SPL and the display module DM may be disposed on the support parts SUP (e.g., in the third direction DR3) in a space between the plurality of joints JU (e.g., in the second direction DR2). In an embodiment, the top surface of the display module DM may have a height less than the height of each of top surfaces of the joints JU. However, embodiments of the present inventive concepts are not limited thereto. For example, the top surface of the display module DM may have the same height as the height of each of the top surfaces of the joints JU.

A lower portion (e.g., in the third direction DR3) of the support layer SPL, the support bars SB, and a lower portion of the display module DM may not be exposed to the outside by the support parts SUP. The support parts SUP and the joints JU may provide a case for accommodating the support layer SPL, the support bars SB, and the display module DM.

Referring to FIGS. 11A, 11B, and 12, as the joints JU that are coupled by the connection parts CP rotate, the module support part MSP and the display module DM may be rolled. This configuration will be described below with reference to FIG. 13.

Figure 13:
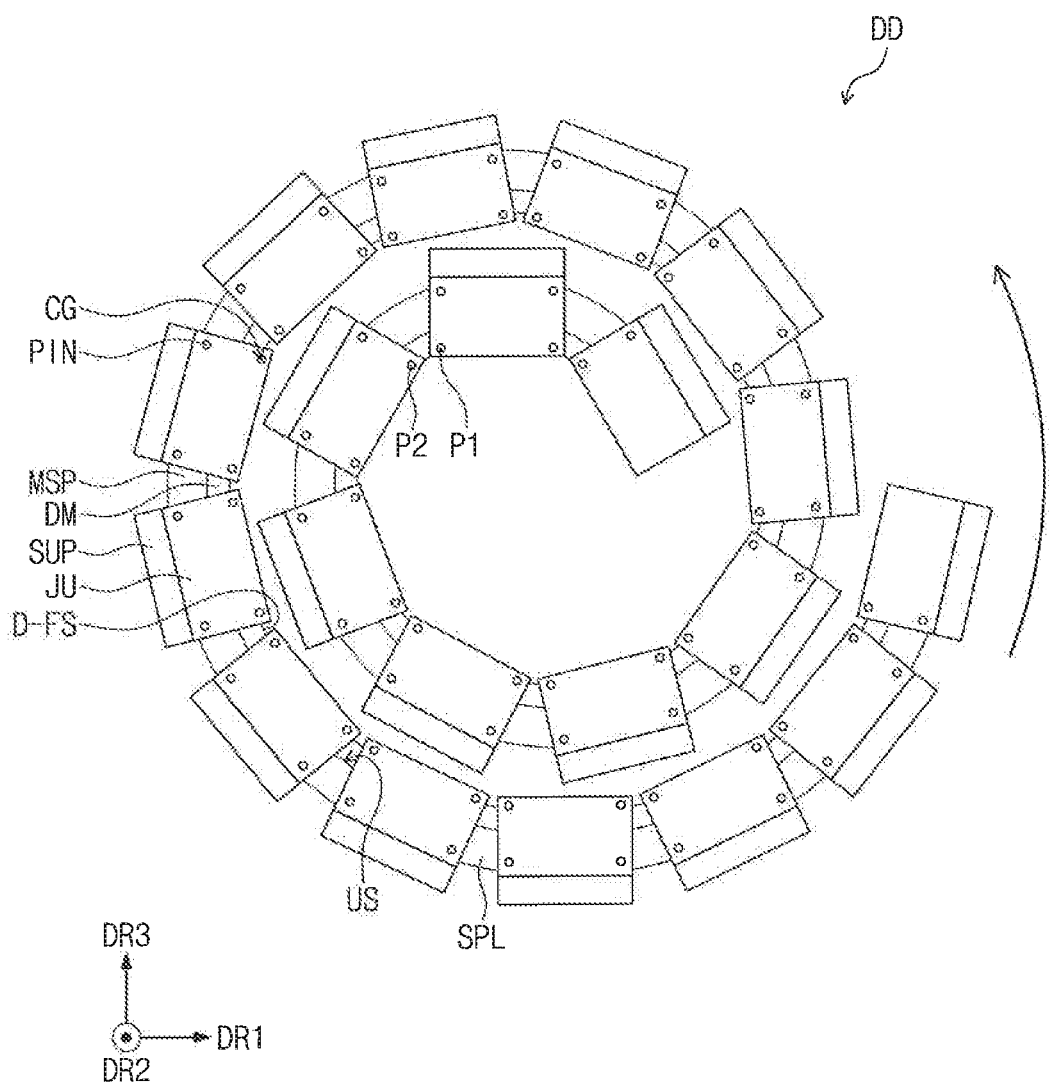
FIG. 13 is a side view illustrating a state in which the module support part and the display module are rolled as the joints of FIG. 12 rotate according to an embodiment of the present inventive concepts.

FIG. 13 is a view illustrating a state in which the module support part and the display module are rolled as the joints in FIG. 12 rotate.

The connection parts CP are omitted in FIG. 13 to clearly illustrate a state in which the joints JU, the module support part MSP, and the display module DM are rolled.

Referring to FIG. 13, as the joints JU rotate around the first and second points P1 and P2, the joints JU may be rolled. As the joints JU and the support parts SUP are rolled, the module support part MSP and the display module DM may be rolled. In an embodiment, as the display module DM is rolled, a front surface D-FS of the display module DM may not be exposed to the outside. The front surface D-FS of the display module DM may include a display surface for displaying an image IM.

The user may carry the display device DD in a state in which the display module DM is rolled. The user may then unfold the display module DM by unfolding the joints JU and watch an image through the front surface D-FS of the display module DM. Thus, the portability of the display device DD may increase.

Figure 14A:
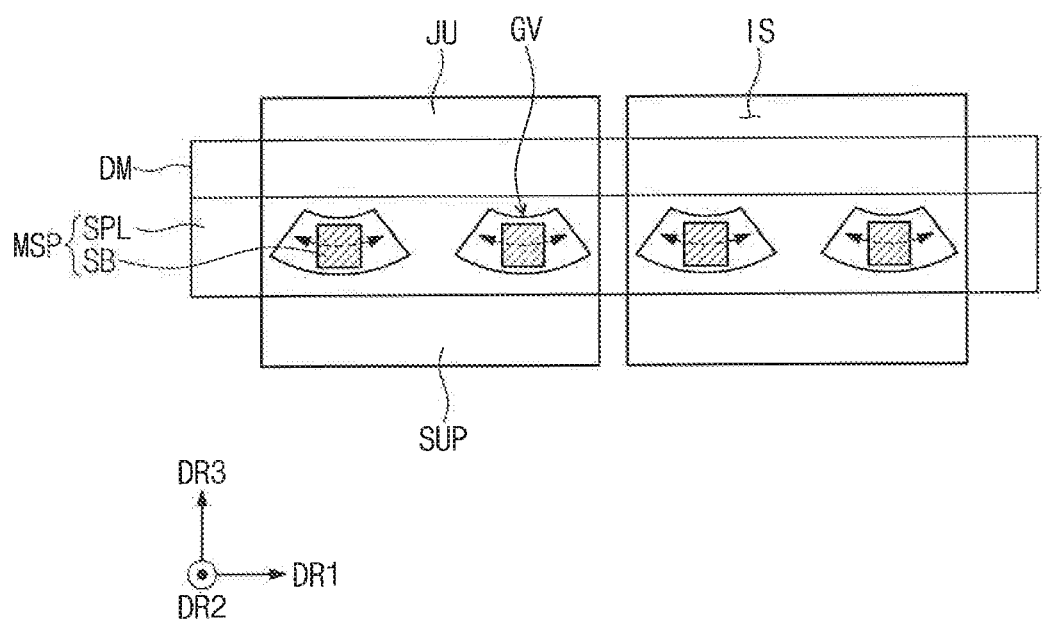
FIGS. 14A, 14B, and 14C are side views showing movement of the support bars disposed in the grooves according to embodiments of the present inventive concepts.
Figure 14B:
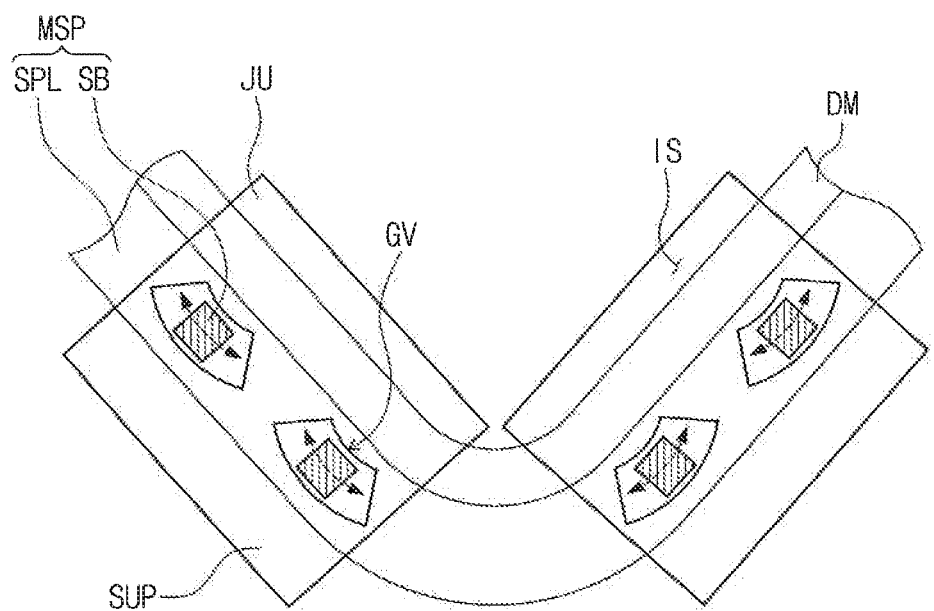
Figure 14B:
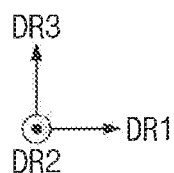
Figure 14C:
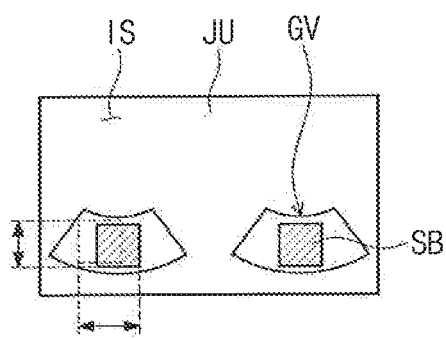

FIGS. 14A, 14B, and 14C are views for explaining movement of the support bars disposed in the grooves.

Hereinafter, FIG. 13 will be described together as necessary for explanation. Also, for example, the module support part MSP and the display module DM are illustrated together with the joints JU and the support bars SB, and the connection parts CP are omitted in FIGS. 14A and 14B. Two support bars SB inserted into any one joint JU are illustrated in FIG. 14C.

Referring to FIGS. 13, 14A, and 14B, the support bars SB may move along the grooves GV. As the joints JU rotate to be folded by a predetermined angle, the display module DM and the module support part MSP may be rolled.

In a comparative embodiment in which the joints JU are fixed so that the support bars SB do not move, a tensile stress may be generated in the module support part MSP because the module support part MSP disposed at further outer side is pulled when the joints JU rotate to be folded by a predetermined angle. For example, a tensile stress may be generated in the support layer SPL having elasticity.

However, in an embodiment of the present inventive concepts, a tensile stress of the module support part MSP may be reduced because the support bars SB move along the grooves GV when the joints JU rotate to be folded by a predetermined maximum angle.

For example, when the joints JU are unfolded to unroll the display module DM and the support layer SPL, each of the support bars SB may be disposed at a central portion of each of the grooves GV. In an embodiment, when the joints JU rotate to be folded by a predetermined maximum angle to roll the display module DM and the support layer SPL, each of the support bars SB may move from the central portion of the groove GV to a left side along the groove GV. However, the embodiment of the inventive concept is not limited thereto. For example, each of the support bars SB may move from the central portion to right side of the groove GV.

Although positions of the support bars SB are described as an example, the support bars SB may be disposed at various positions of the grooves GV.

Referring to FIG. 14C, when the joints JU is unfolded, each of the support bars SB may be disposed at the central portion of the groove GV, and when the joints JU is folded, each of the support bars SB may move from the central portion of the groove GV to the left side along the groove GV.

As each of the grooves GV has a curved shape, each of the support bars SB may move from a lower end to the left side, which is disposed higher than the lower end, of the groove. As each of the grooves GV has a curved shape, each of the support bars SB may freely move in left-right and up-down directions. Thus, mobility of the support bars SB may increase.

As a result, as the mobility of the support bars SB increases by the grooves GV, the tensile stress of the module support part MSP may be reduced when the display module DM and the module support part MSP are rolled.

Figure 15:
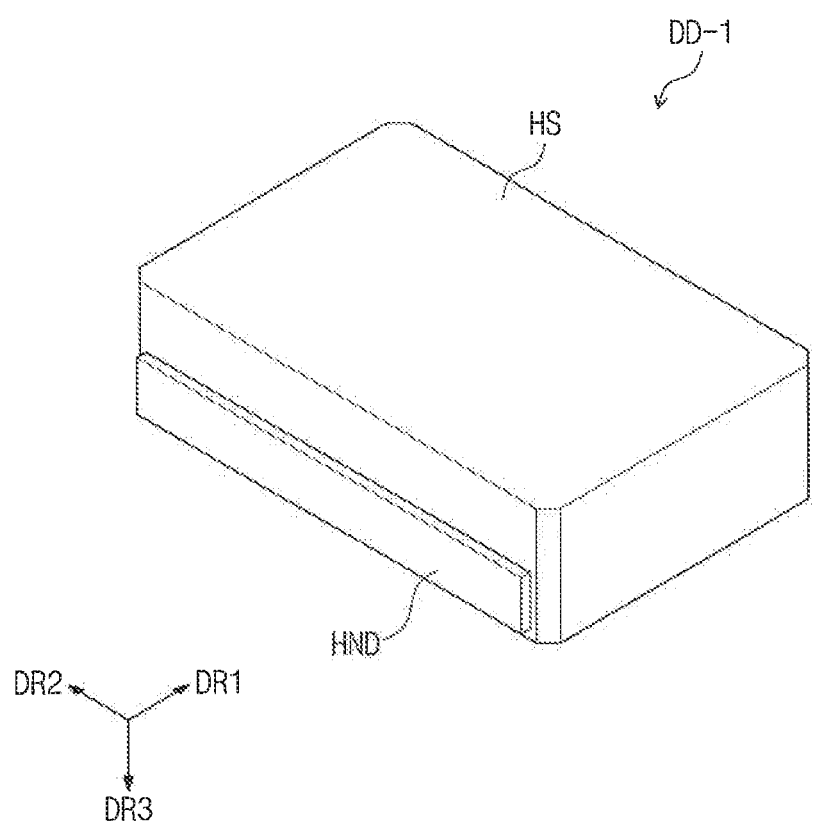
FIGS. 15 and 16 are perspective views illustrating a display device including a housing for accommodating a display module, a module support part, joints, and support parts according to embodiments of the present inventive concepts.
Figure 16:
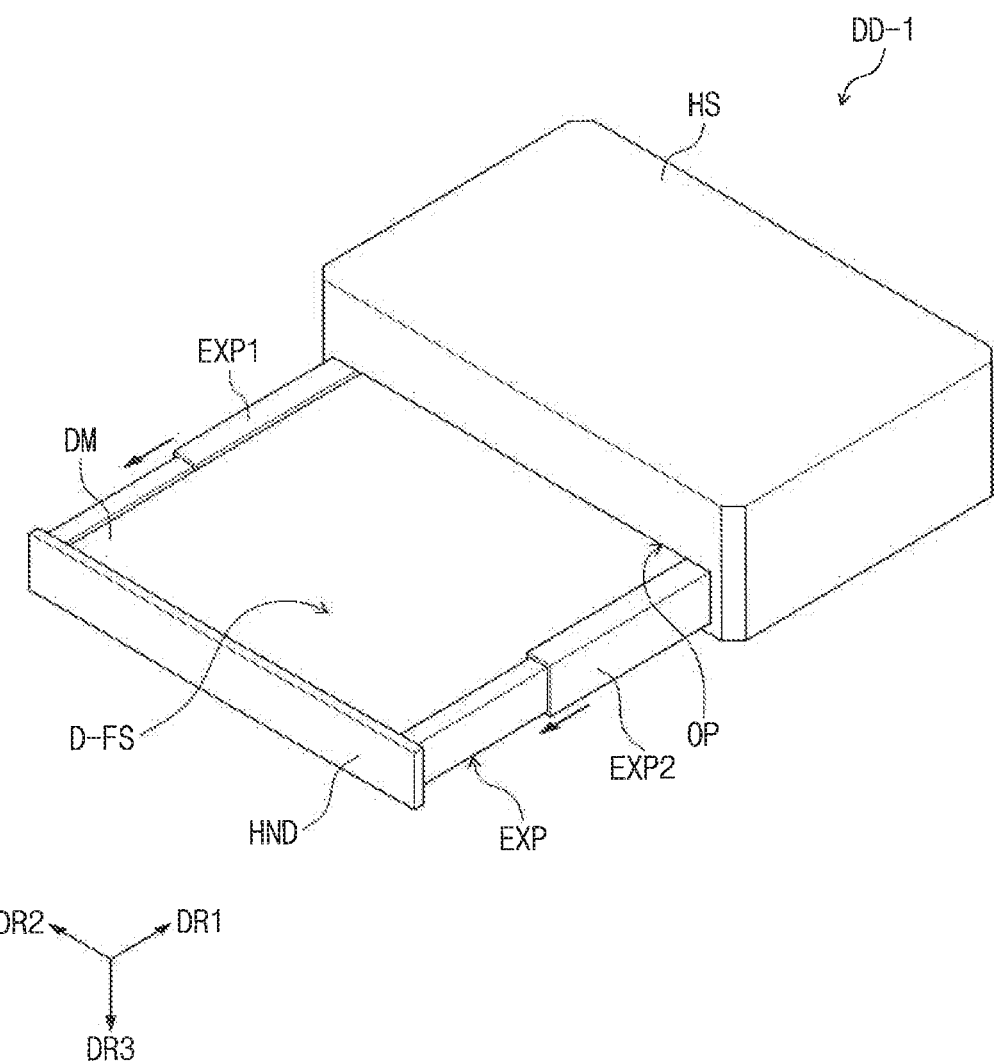

FIGS. 15 and 16 are views illustrating a display device including a housing for accommodating a display module, a module support part, joints, and support parts.

Referring to FIGS. 15 and 16, a display device DD-1 may include a housing HS, a display module DM accommodated in the housing HS, a handle HND connected to the display module DM, an extension part disposed adjacent to each of both sides of the display module DM.

Although the embodiment of FIG. 16 shows the housing HS having a hexahedral shape, embodiments of the present inventive concepts are not limited thereto and the shape of the housing HS may vary. In an embodiment, the housing HS may have relatively long sides that extend in the second direction DR2 and relatively short sides that extend in the first direction DR1.

An opening OP may be defined at a first side of first and second sides of the housing HS, which are opposite to each other in the first direction DR1. In an embodiment, the opening OP may be disposed closer to a lower portion of the housing HS than an upper portion of the housing HS.

The display module DM may be wound around a roller disposed in the housing HS, and inserted and withdrawn through the opening OP. Hereinafter, a configuration of the display module DM wound around the roller will be described in detail. The display module DM may be inserted and withdrawn through the opening OP.

The handle HND may be disposed at an outer side of the housing HS and disposed adjacent to the opening OP. In an embodiment, the handle HND may be disposed adjacent to a lower portion (e.g., in the third direction DR3) of the housing HS. In an embodiment, the handle HND may move in the first direction DR1. When the handle HND moves in the first direction DR1 to be disposed away from the housing HS, the display module DM may be withdrawn to the outside of the housing HS through the opening OP. The handle HND may be manipulated by the user.

The extension part EXP may be disposed at each of first and second sides of the display module DM, which are opposite to each other in the second direction DR2, to support the display module DM. The above-described configuration will be described below in detail. The extension part EXP may include a first extension part EXP1 adjacent to a first side of the display module DM and a second extension part EXP2 adjacent to the second side of the display module DM.

As illustrated in FIG. 15, a state in which the display module DM is accommodated in the housing HS may be defined as a closed mode. As illustrated in FIG. 16, a state in which the display module DM extends to the outside of the housing HS may be defined as an extended mode.

Figure 17:
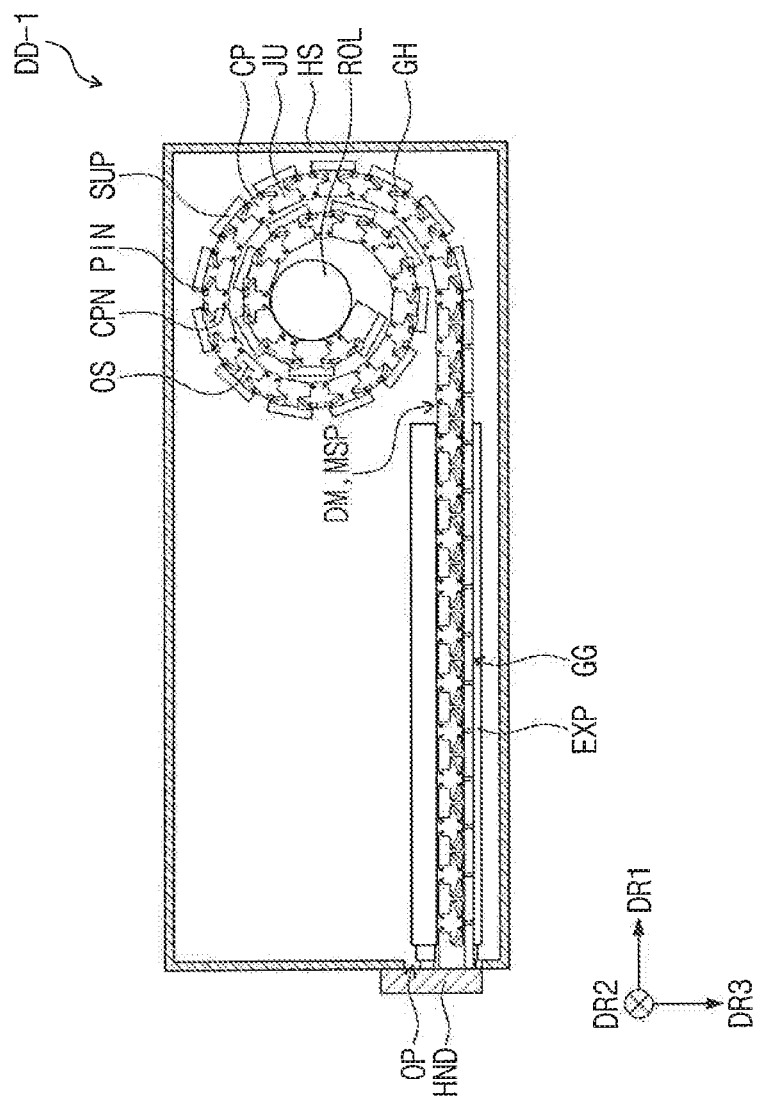
FIG. 17 is a cross-sectional view illustrating an inner configuration of the housing in a closed mode of FIG. 15 according to an embodiment of the present inventive concepts.

FIG. 17 is a view illustrating an inner configuration of the housing in the closed mode in FIG. 15.

For example, outer surfaces OS of joints JU and side surfaces of connection parts CP disposed in the housing are illustrated in FIG. 17. Also, a cross-section of the extension part EXP is shown to illustrate a portion of the extension part EXP, on which the joints JU are disposed.

Hereinafter, FIGS. 12 and 15 will be described together as necessary for explanation.

Referring to FIGS. 12, 15, and 17, the display device DD-1 may include a roller ROL, a display module DM, a module support part MSP, joints JU, support parts SUP, and connection parts CP. The roller ROL, the display module DM, the module support part MSP, the joints JU, the support parts SUP, and the connection parts CP may be accommodated in the housing HS.

Although the display module DM and the module support part MSP are not shown in FIG. 17 because the outer surfaces OS of the joints JU and the side surfaces of the connection parts CP are illustrated, the display module DM and the module support part MSP may be disposed inside the joints JU as illustrated in FIG. 12.

The roller ROL may be disposed in the housing IS and disposed adjacent to the second side of the housing HS, which is an opposite side (e.g., in the first direction DR1) of the first side of the housing HS at which the opening OP is defined. In an embodiment, the roller ROL may have a cylindrical shape extending longitudinally in the second direction DR2. The roller ROL may rotate in clockwise and counterclockwise directions. In an embodiment, the display device DD-1 may further include a driving part for allowing the roller ROL to rotate.

The joint JU disposed at a foremost side among the joints JU may be connected to the roller ROL. For example, the pair of joints JU arranged farthest on the support layer SPL in the first direction DR1 towards the roller ROL may be connected to the roller ROL. A first side of the display module DM and a first side of the module support part MSP may be also connected to the roller ROL together with the joint JU disposed at the foremost side. The joints JU, the display module DM, and the module support part MSP may be wound around, or unwound from, the roller ROL.

A portion of the joints JU, a portion of the display module DM, and a portion of the module support part MSP may be wound around the roller ROL. The remaining (unwound) portion of the joints JU, the other portion of the display module DM, and the other portion of the module support part MSP may be disposed to overlap the extension part EXP instead of being wound around the roller ROL.

The second side of the display module DM, the second side of the module support part MSP, and the other foremost side of the joint JU, which is disposed adjacent to the second side of the display module DM, may be connected to the handle HND and disposed adjacent to the opening OP.

Figure 18:
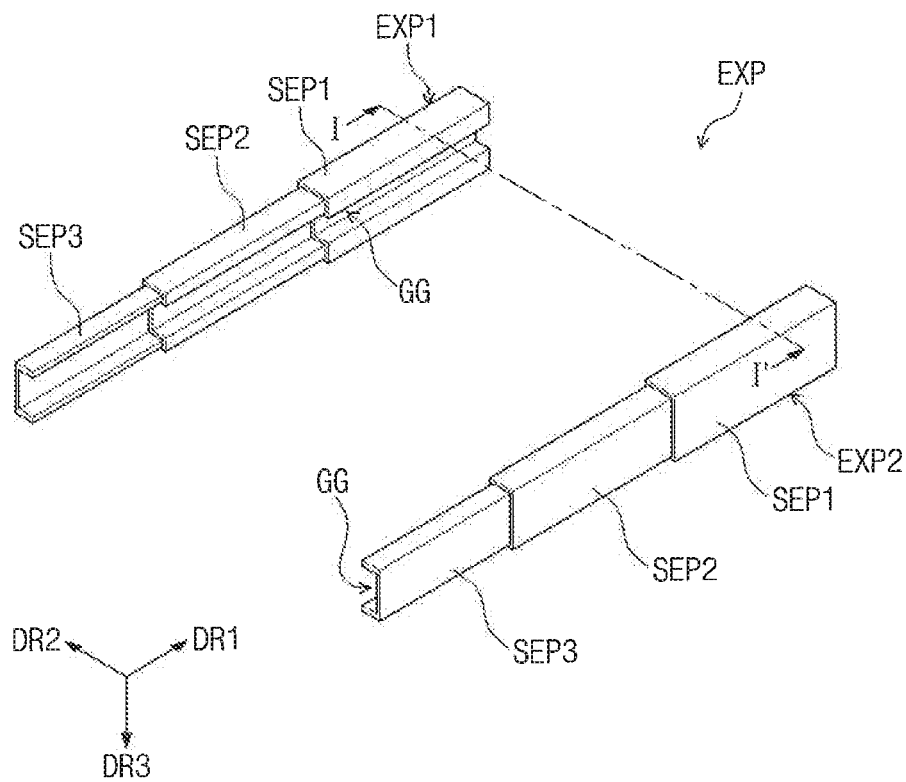
FIG. 18 is a perspective view illustrating an extension part of FIG. 17 according to an embodiment of the present inventive concepts.
Figure 19:
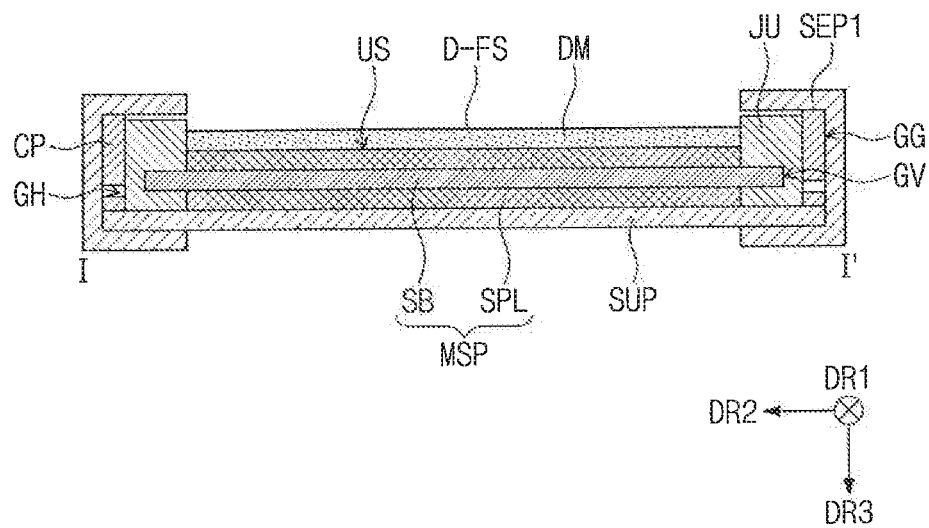
FIG. 19 is a cross-sectional view taken along I-I' of FIG. 18 illustrating first sub-extension parts, which is, together with cross-sections of the display module, the module support part, the joint, and the connection part according to an embodiment of the present inventive concepts.

FIG. 18 is a perspective view illustrating the extension part in FIG. 17. FIG. 19 is a view illustrating a cross-section of first sub-extension parts, which is taken along I-I' in FIG. 18, together with cross-sections of the display module, the module support part, the joint, and the connection part.

Referring to FIGS. 18 and 19, the extension part EXP may include a first extension part EXP1 and a second extension part EXP, which extend longitudinally in the first direction DR1 and are spaced apart from each other in the second direction DR2. Guide grooves GG may be defined in an inner surface of the first extension part EXP1 and an inner surface of the second extension part EXP2.

As illustrated in FIG. 19, the joints JU, both sides of the support parts SUP, and the connection parts CP may be disposed in the guide grooves GG. Since the support bars SB are connected to the joints JU, both sides of the module support part MSP may be supported by the first extension part EXP1 and the second extension part EXP2.

The joints JU and the support parts SUP may move along the guide grooves GG in the first direction DR1. Thus, the module support part MSP and the display module DM may also move in the first direction DR1 together with the joints JU.

As shown in the embodiment of FIG. 18, each of the first and second extension parts EXP1 and EXP2 may include a first sub-extension part SEP1, a second sub-extension part SEP2, and a third sub-extension part SEP3 to extend to the outside of the housing HS. The second sub-extension part SEP2 may be disposed between the first sub-extension part SEP1 and the third sub-extension part SEP3 (e.g., in the first direction DR1.

To have a telescoping structure, the second sub-extension part SEP2 may be inserted into and withdrawn from the first sub-extension part SEP1, and the third sub-extension part SEP3 may be inserted into and withdrawn from the second sub-extension part SEP2. The third sub-extension part SEP3 may be connected to the handle HND.

The guide groove GG may be defined in each of the first, second, and third sub-extension part SEP1, SEP2, and SEP3. The guide grooves GG defined in the first, second, and third sub-extension part SEP1, SEP2, and SEP3 may define consecutive spaces overlapping each other in the first direction DR1.

The first sub-extension parts SEP1 of the first and second extension parts EXP1 and EXP2 may be connected to the housing HS. For example, the first sub-extension parts SEP1 may be connected and fixed to inner surfaces of the housing HS, which face each other in the second direction DR2.

In the extended mode, the first sub-extension parts SEP1 may be disposed in the housing HS, and the second and third sub-extension parts SEP2 and SEP3 may extend outside of the housing HS (e.g., in the first direction DR1).

Figure 20:
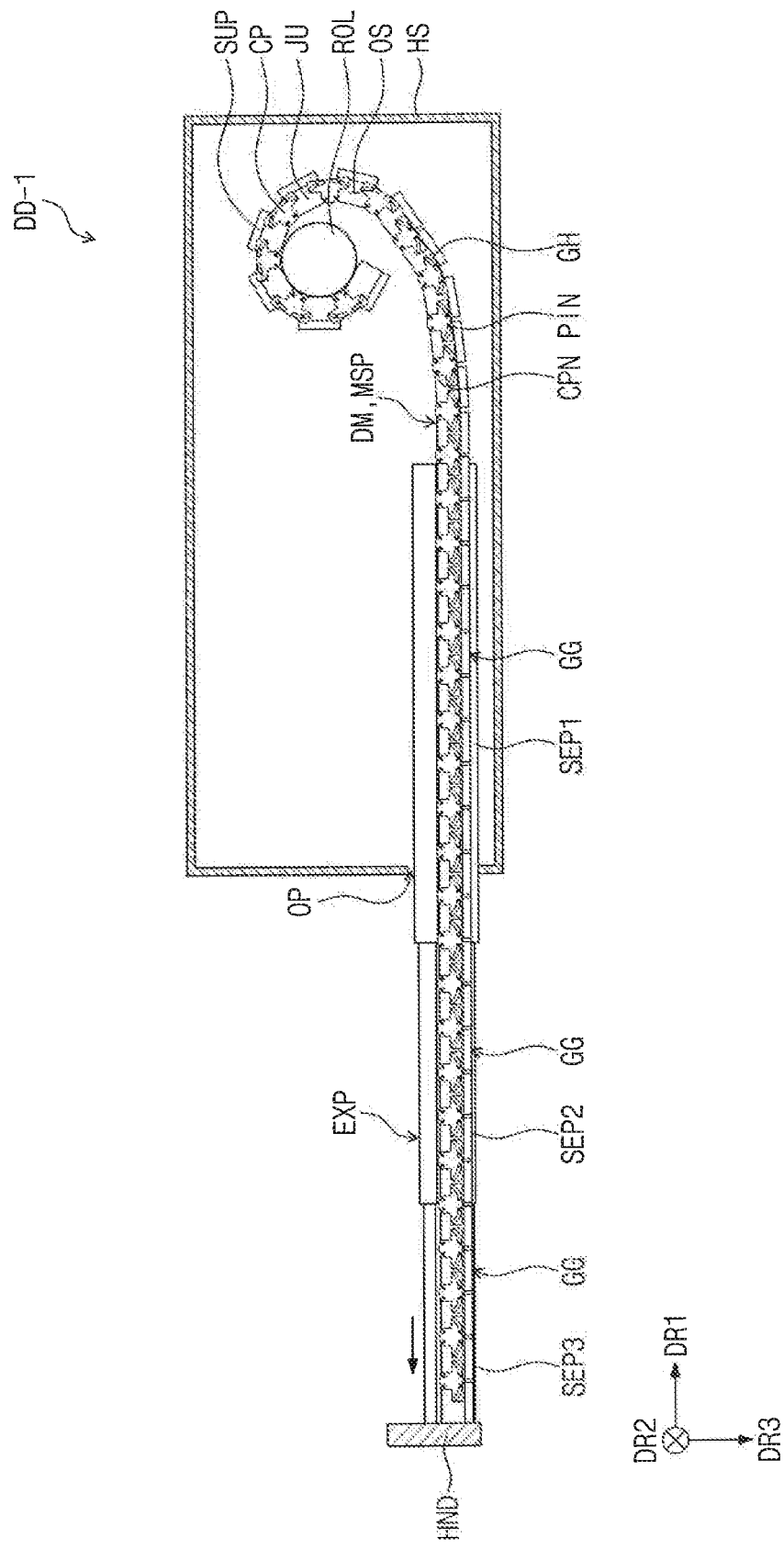
FIG. 20 is a cross-sectional view illustrating an inner configuration of the housing in an extended mode of FIG. 16 according to an embodiment of the present inventive concepts.

FIG. 20 is a view illustrating an inner configuration of the housing in the extended mode in FIG. 16.

Hereinafter, FIGS. 12 and 16 will be described together as necessary for explanation.

Referring to FIGS. 12, 16, and 20, as previously described in FIG. 17, the display module DM and the module support part MSP may not be shown in FIG. 20 because the outer surfaces OS of the joints JU and the side surfaces of the connection parts CP are illustrated. However, as illustrated in FIG. 12, the display module DM and the module support part MSP may be disposed inside the joints JU.

The handle HND may move to be positioned away from the housing HS in the first direction DR1. As the handle HND moves, the display module DM and the module support part MSP connected to the handle HND may move in the first direction DR1.

As the handle HND moves, the joints JU and the support parts SUP may move in the first direction DR1. As the handle HND moves, the second sub-extension part SEP2 may be withdrawn from the first sub-extension part SEP1, and the third sub-extension part SEP3 may be withdrawn from the second sub-extension part SEP2.

As the handle HND moves, the display module DM, the module support part MSP, the joints JU, and the support parts SUP may be unwound from the roller ROL. Thus, a portion of the display module DM, a portion of the module support part MSP, a portion of the joints JU, and a portion of the support parts SUP may be withdrawn to extend outside of the housing HS through the opening OP and be exposed to the outside. An image IM may be provided to the user through the display module DM exposed to the outside, such as the front surface D-FS (FIG. 13) of the display module DM.

When the handle HND moves to be close to the housing HS in the first direction DR1, the handle HND may be disposed adjacent to the opening OP at the outer side of the housing HS as illustrated in FIGS. 15 and 17. As the handle HND moves, the display module DM, the module support part MSP, the joints JU, and the support parts SUP may be inserted into the housing and wound around the roller ROL.

According to an embodiment of the present inventive concepts, since the display module is supported through the module support part including the support layer and the support bars disposed in the support layer, the flatness of the display module may be increased.

Also, as the joints coupled to rotate with respect to each other are connected to the support bars, and at least two support bars are connected to one joint to support the display module with respect to the major axis, the display module may have increased support.

Although embodiments of the present inventive concepts have been described, it is understood that the present inventive concepts should not be limited to these embodiments but various changes and modifications can be made by one ordinary skilled in the art within the spirit and scope of the present inventive concepts.

What is claimed is:

1. A display device comprising:
a display module;
a support layer disposed below the display module;
a plurality of support bars disposed inside the support layer, extending longer than the support layer, and extending outside of the support layer, each of the plurality of support bars includes first and second ends that are disposed outside of the support layer, and
a plurality of joints configured to receive the first and second ends of the plurality of support bars, the plurality of joints are coupled to each other,
wherein the coupled plurality of joints are configured to rotate with respect to each other.

2. The display device of claim 1, wherein:
the plurality of joints include grooves defined therein; and
the grooves are configured to receive the first and second ends of the plurality of support bars.

3. The display device of claim 2, wherein:
the plurality of support bars move along the grooves when the display module and the support layer are rolled or unrolled.

4. The display device of claim 2, wherein:
the plurality of support bars are arranged in a first direction and extend in a second direction crossing the first direction, and
the plurality of joints include pairs of joints arranged in the first direction, each pair of joints includes first and second joints that are spaced apart from each other in the second direction with the support layer therebetween.

5. The display device of claim 4, wherein each of the grooves is defined in inner surfaces of the first and second joints, the inner surfaces facing each other in the second direction.

6. The display device of claim 4, further comprising:
a plurality of support parts disposed below the plurality of joints and the support layer, the plurality of support parts are arranged in the first direction and extend in the second direction,
wherein the plurality of joints are adjacent to first and second sides of the plurality of support parts.

7. The display device of claim 6, wherein:
the support layer and the display module are disposed on the plurality of support parts in a space defined between the plurality of joints.

8. The display device of claim 7, wherein a height of a top surface of the display module is less than or equal to a height of a top surface of each of the plurality of joints.

9. The display device of claim 4, further comprising a plurality of connection parts connected to outer surfaces of the plurality of joints to couple the plurality of joints to rotate with respect to each other.

10. The display device of claim 9, wherein a k-th connection part couples a k-th joint to a (k+1)-th joint, that are arranged in the first direction, to rotate with respect to each other, the k-th connection part limits a folded angle between the k-th joint and the (k+1)-th joint to a predetermined folded angle range, wherein k is a natural number.

11. The display device of claim 10, wherein:
the k-th connection part is connected to a first point that is adjacent to an upper end of the k-th joint and a first side of the k-th joint adjacent to the (k+1)-th joint;
the k-th connection part is connected to a second point that is adjacent to an upper end of the (k+1)-th joint and a first side of the (k+1)-th joint adjacent to the first side of the k-th joint; and
the k-th joint and the (k+1)-th joint rotate around the first point and the second point, respectively.

12. The display device of claim 10, further comprising:
a first pin protruding from an outer surface of the k-th joint; and
a second pin protruding from an outer surface of the (k+1)-th joint,
the k-th connection part includes a first guide hole and a second guide hole defined therein;
wherein the first pin is received into the first guide hole to move along the first guide hole,
wherein the second pin is received into the second guide hole defined in the k-th connection part to move along the second guide hole, and
wherein the first guide hole and the second guide hole have curved shapes that are symmetrical to each other.

13. The display device of claim 2, wherein at least two grooves are defined in each of the plurality of joints; and
each of the at least two grooves receives at least one of the first and second ends of the plurality of support bars.

14. The display device of claim 2, wherein each of the grooves has one of a curved shape or a linear shape.

15. The display device of claim 2, wherein:
a single groove is defined in each of the plurality of joints; and
the single grooves receives at least two of the first and second ends of the plurality of support bars.

16. The display device of claim 1, wherein each of the plurality of support bars has a modulus that is greater than a modulus of the support layer.

17. The display device of claim 1, further comprising:
a roller that the plurality of joints are wound and unwound around; and
a housing configured to accommodate the display module, the support layer, the plurality of support bars, the plurality of joints, and the roller,
wherein the plurality of joints are unwound from the roller and withdrawn to the outside of the housing together with the display module.

18. A display device comprising:
a display module;
a support layer disposed below the display module;
a plurality of support bars disposed inside the support layer, extending longer than the support layer, and protruding from first and second sides of the support layer; and
a plurality of joints arranged along the first and second sides of the support layer, the plurality of joints are coupled to each other and the coupled plurality of joints are configured to rotate with respect to each other,
wherein at least two support bars of the plurality of support bars are inserted into grooves defined in a k-th joint of the plurality of joints, wherein the k is a natural number.

19. The display device of claim 18, further comprising:
a plurality of support parts disposed below the plurality of joints and the support layer,
wherein the plurality of joints and the plurality of support parts are rolled so that a front surface of the display module is not exposed to the outside.

20. The display device of claim 18, wherein the plurality of support bars move along the grooves of the plurality of joints when the display module and the support layer are rolled or unrolled.

\* \* \* \* \*